(12) United States Patent
Tamura et al.

(10) Patent No.: US 8,586,438 B2
(45) Date of Patent: Nov. 19, 2013

(54) SEMICONDUCTOR DEVICE AND MANUFACTURING METHOD THEREOF

(75) Inventors: Naoyoshi Tamura, Kawasaki (JP); Yosuke Shimamune, Kawasaki (JP); Hirotaka Maekawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/412,967

(22) Filed: Mar. 6, 2012

(65) Prior Publication Data

US 2012/0171829 A1    Jul. 5, 2012

Related U.S. Application Data

(60) Division of application No. 12/826,002, filed on Jun. 29, 2010, now Pat. No. 8,338,831, which is a continuation of application No. PCT/JP2008/051071, filed on Jun. 29, 2010.

(51) Int. Cl.
*H01L 21/336* (2006.01)

(52) U.S. Cl.
USPC ............................ 438/285; 438/290; 438/300

(58) Field of Classification Search
USPC ................... 257/77, 192, 195, 196, E21.409, 257/E29.255; 438/285, 290, 300
See application file for complete search history.

(56) References Cited

U.S. PATENT DOCUMENTS

| | | |
|---|---|---|
| 6,924,518 B2 | 8/2005 | Iinuma et al. |
| 7,132,338 B2 | 11/2006 | Samoilov et al. |
| 7,372,099 B2 | 5/2008 | Yasutake |
| 7,626,215 B2 | 12/2009 | Shimamune et al. |
| 7,649,232 B2 | 1/2010 | Tamura et al. |
| 7,667,227 B2 | 2/2010 | Shimamune et al. |
| 2005/0006637 A1 | 1/2005 | Iinuma et al. |

(Continued)

FOREIGN PATENT DOCUMENTS

| | | |
|---|---|---|
| CN | 101114673 A | 1/2008 |
| JP | 2005-033137 A | 2/2005 |

(Continued)

OTHER PUBLICATIONS

D. De Salvador et al, "Lattice parameter of Si1-x-yGexCy alloys", Physical Review B, May 15, 2000, p. 13005-13013, vol. 61 No. 19.

(Continued)

*Primary Examiner* — Walter H Swanson
*Assistant Examiner* — Wilner Jean Baptiste
(74) *Attorney, Agent, or Firm* — Westerman, Hattori, Daniels & Adrian, LLP

(57) ABSTRACT

Recesses are formed in a pMOS region 2, and a SiGe layer is then formed so as to cover a bottom surface and a side surface of each of the recesses. Next, a SiGe layer containing Ge at a lower content than that in the SiGe layer is formed on each of the SiGe layers.

20 Claims, 22 Drawing Sheets

(56) References Cited

U.S. PATENT DOCUMENTS

| | | | |
|---|---|---|---|
| 2005/0079692 A1 | 4/2005 | Samoilov et al. | |
| 2005/0170577 A1 | 8/2005 | Yao et al. | |
| 2006/0138398 A1 | 6/2006 | Shimamune et al. | |
| 2006/0220113 A1 | 10/2006 | Tamura et al. | |
| 2006/0270133 A1 | 11/2006 | Yasutake | |
| 2007/0254414 A1* | 11/2007 | Miyanami | 438/149 |
| 2008/0023773 A1 | 1/2008 | Shimamune et al. | |
| 2008/0128746 A1 | 6/2008 | Wang | |
| 2009/0039399 A1* | 2/2009 | Sudo | 257/288 |
| 2009/0134381 A1 | 5/2009 | Shimamune et al. | |
| 2010/0015774 A1 | 1/2010 | Shimamune et al. | |

FOREIGN PATENT DOCUMENTS

| | | |
|---|---|---|
| JP | 2006-186240 A | 7/2006 |
| JP | 2006-278776 A | 10/2006 |
| JP | 2006-332337 A | 12/2006 |
| JP | 2007-294780 A | 11/2007 |
| JP | 2007-537601 A | 12/2007 |

OTHER PUBLICATIONS

K. Mistry et al, "Delaying Forever: Uniaxial Strained Silicon Transistors in a 90nm CMOS Technology", 2004 Symposium on VLSI Technology Digest of Technical Papers, Jun. 2004, p. 50-51.

R. People and J. C. Bean, "Calculation of critical layer thickness versus lattice mismatch for GexSi1-x/Si strained-layer heterostructures", Applied Physics Letters, Aug. 1, 1985, p. 322-324, vol. 47 No. 3.

International Search Report of PCT/JP2008/051071, Mailing Date of Apr. 22, 2008.

Chinese Office Action dated Jul. 20, 2011, issued in corresponding Chinese Patent Application No. 200880125404.6.

Notification of Transmittal of Translation of the International Preliminary Report on Patentability (Form PCT/IB/338) of International Application No. PCT/JP2008/051071 mailed Sep. 10, 2010 with forms PCT/IB/373 and PCT/ISA/237.

US Office Action dated Apr. 12, 2012, issued in corresponding U.S. Appl. No. 12/826,002.

* cited by examiner

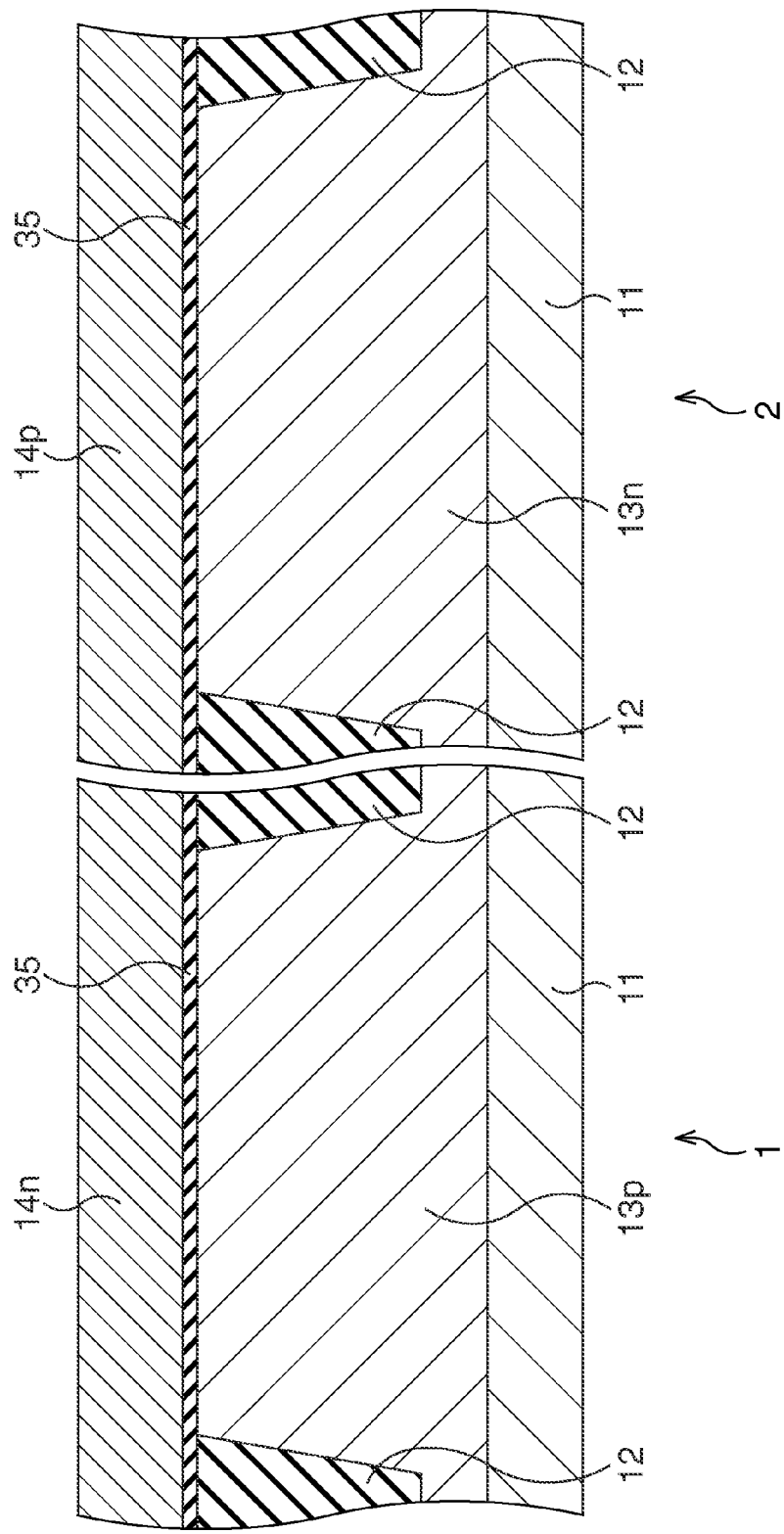

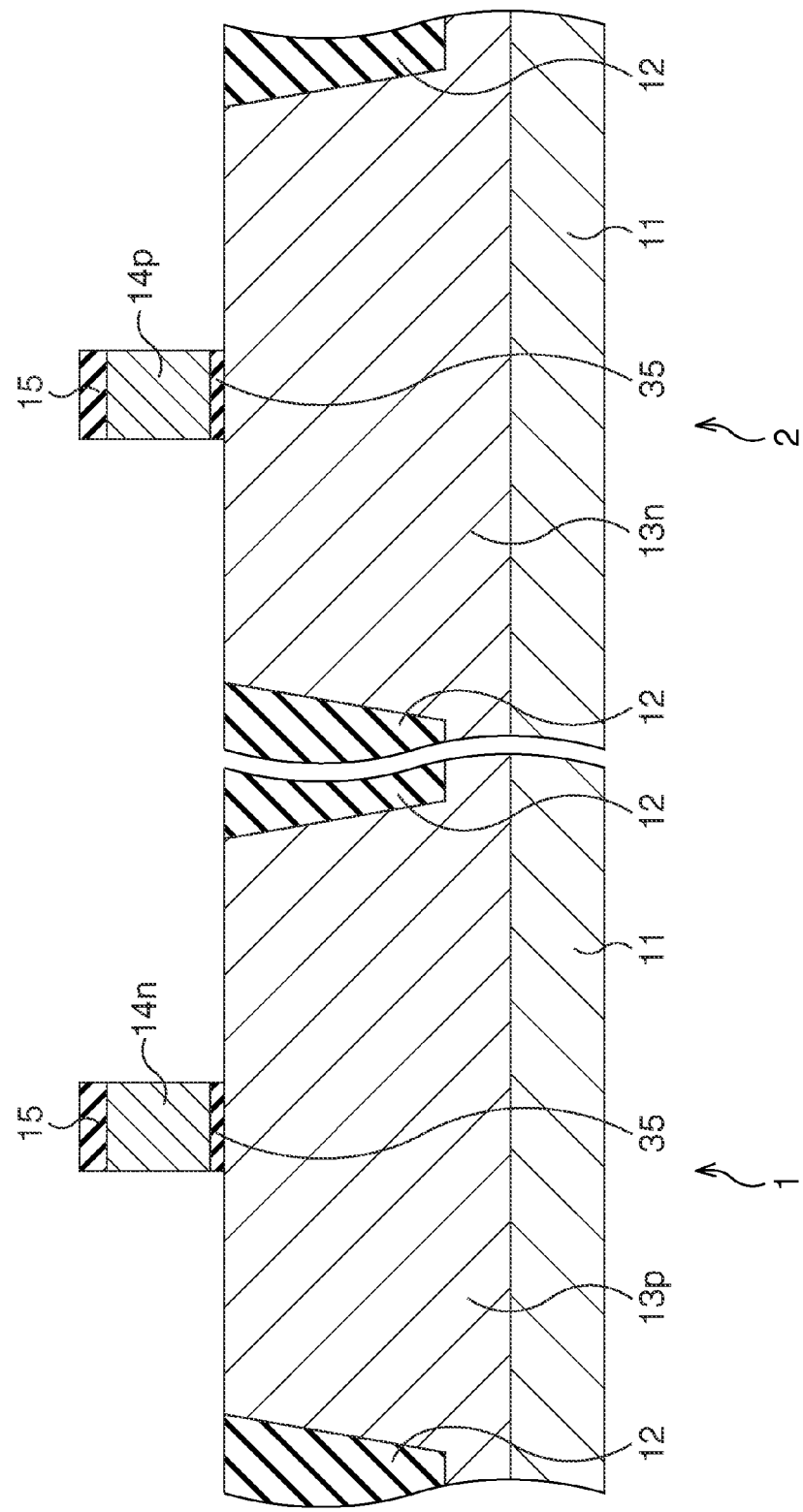

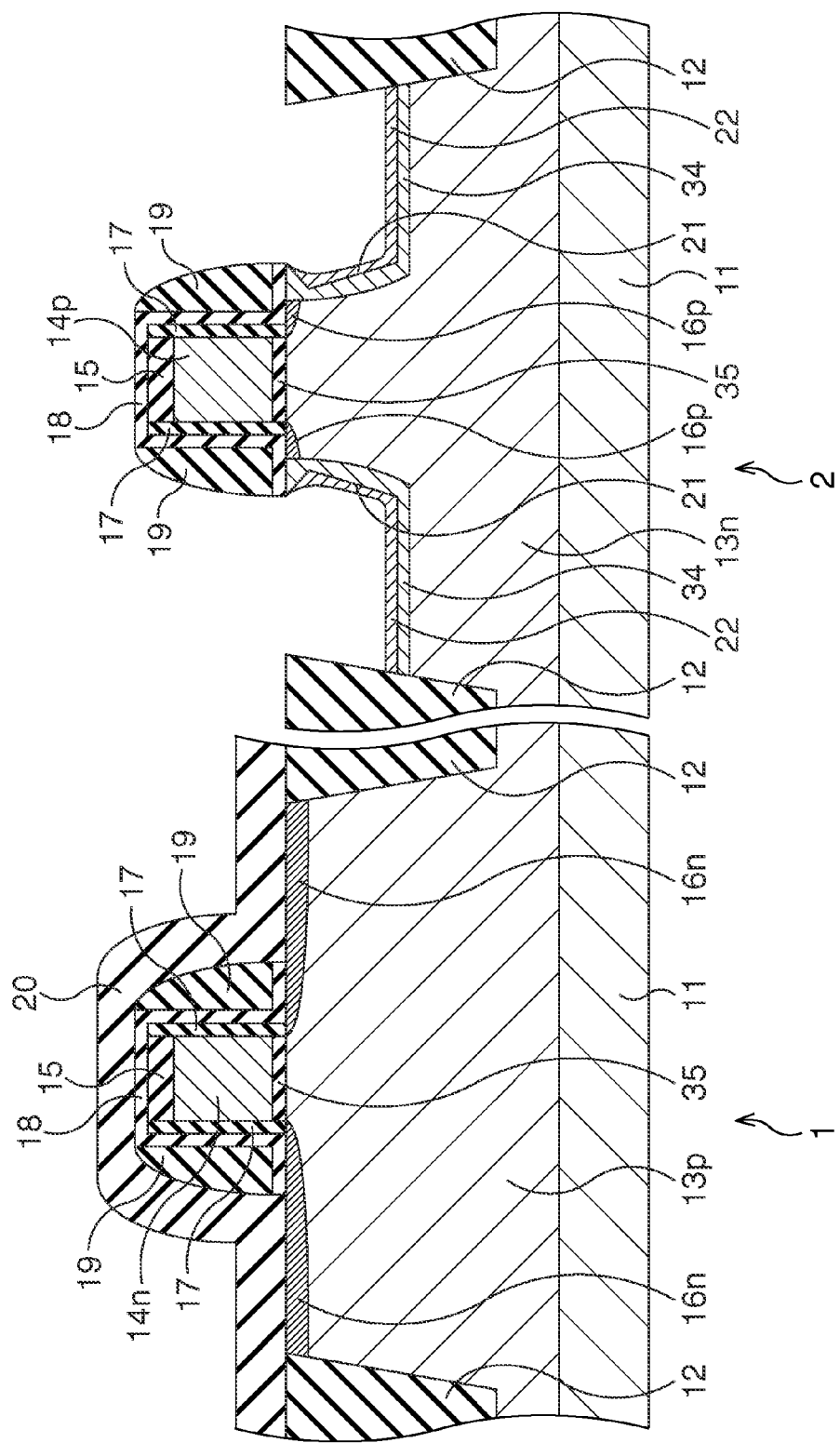

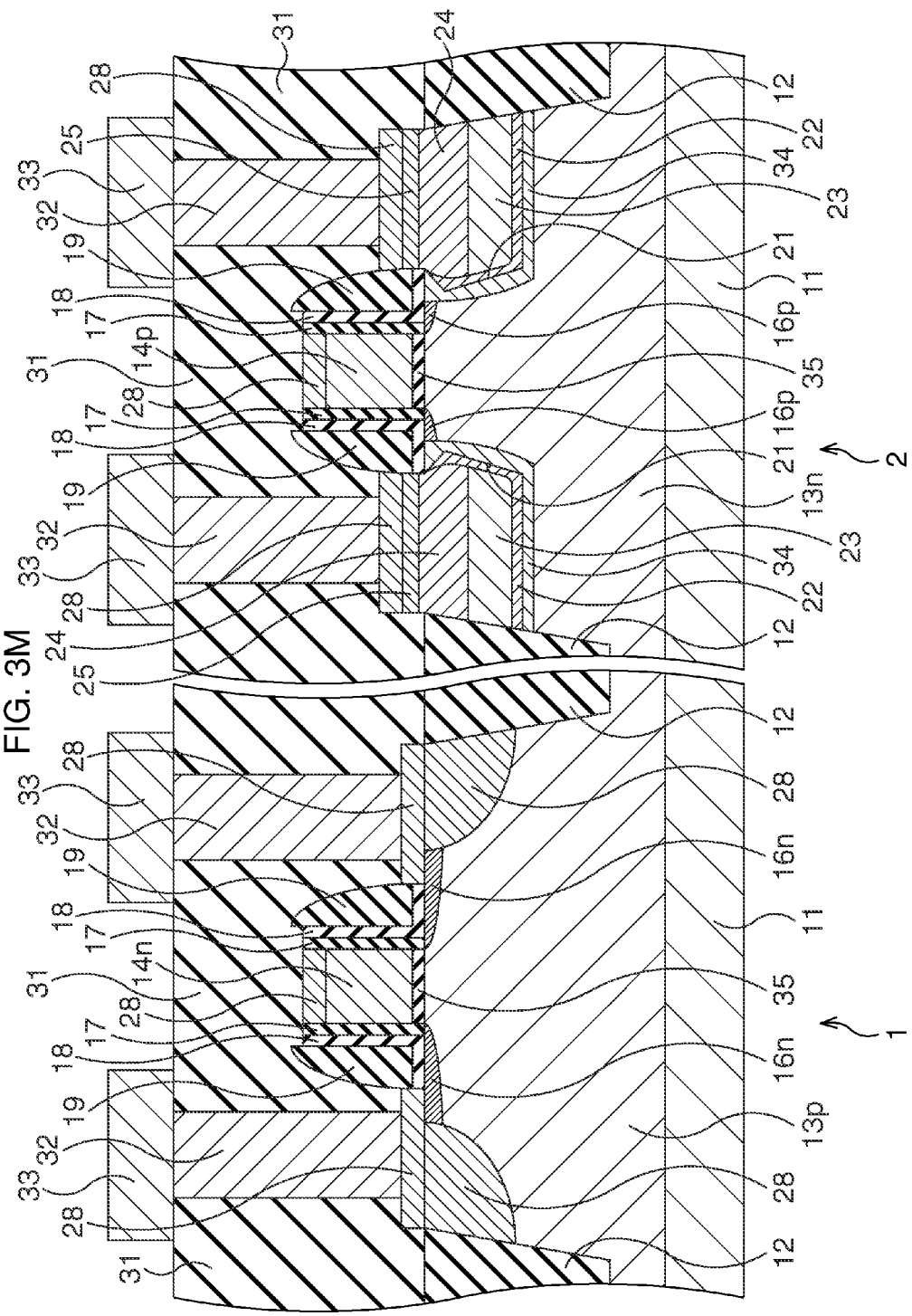

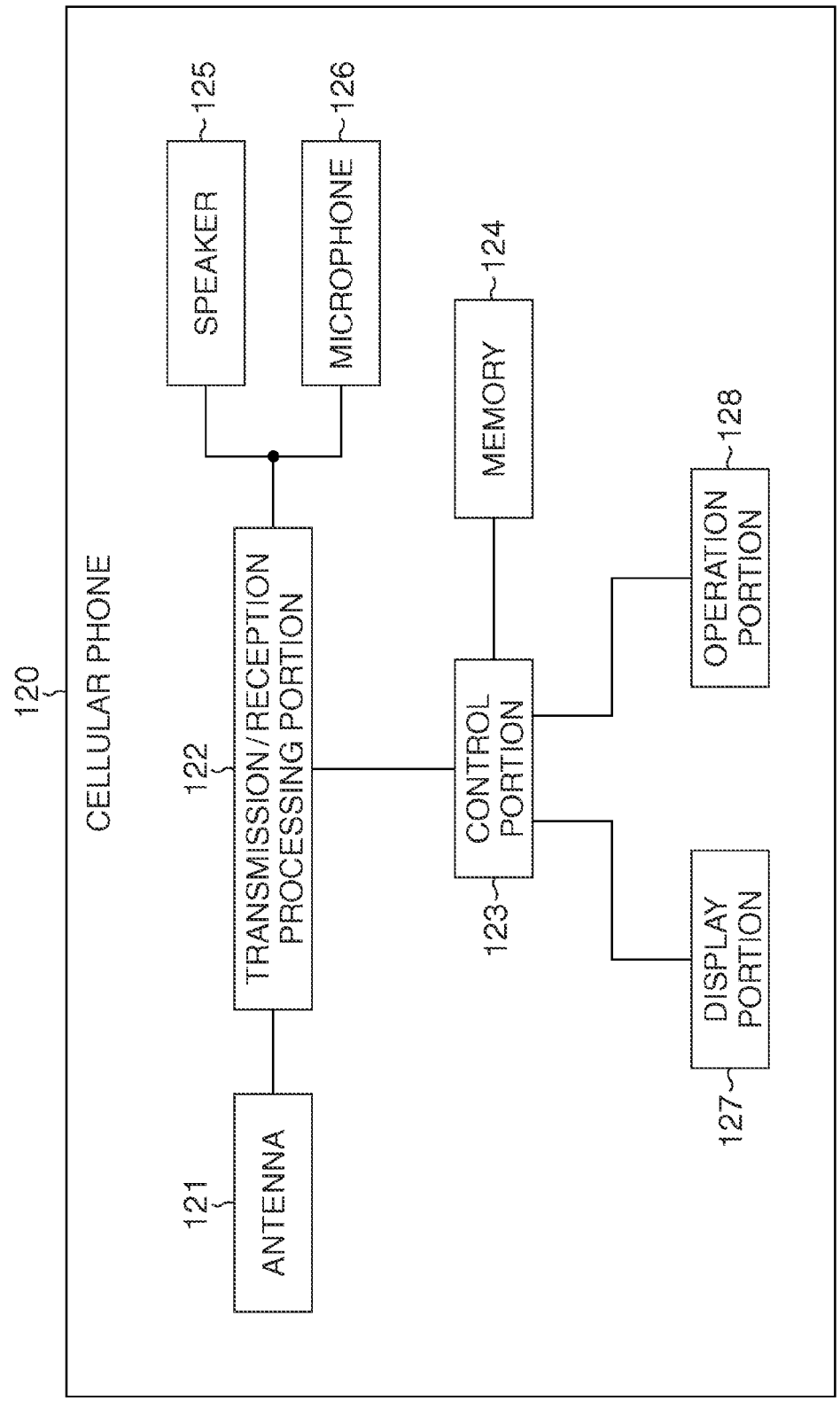

SEMICONDUCTOR DEVICE AND MANUFACTURING METHOD THEREOF

CROSS-REFERENCE TO RELATED APPLICATIONS

This application is a divisional of application Ser. No. 12/826,002, filed on Jun. 29, 2010, which is a Continuation of International Application No. PCT/JP2008/051071, with an international filing date of Jan. 25, 2008, which designating the United States of America, the entire contents of which are incorporated herein by reference.

FIELD

The present embodiment relates to a semiconductor device capable of operating at high speed and a manufacturing method thereof.

BACKGROUND

In an LSI with a transistor or the like of a process rule of 90 nm node and thereafter, a standby off-leak current accompanying miniaturization of elements is not negligible. Therefore, it becomes difficult to improve device performance only by simple miniaturization of a gate length of a transistor, and thus a new approach is needed for improving the device performance.

With such an ultra-miniaturized transistor, the dimension of a channel region located right below a gate electrode is very small as compared with conventional transistors. It is known that the mobility of carriers (electrons and holes) running in the channel region is largely affected by stress applied to the channel region in such a case. Accordingly, a large number of attempts have been made to improve the operation speed of a semiconductor device by adjusting such stress.

In general, in a transistor in which a region of its silicon substrate where an impurity is introduced is the channel, the mobility of holes is smaller than that of electrons. Therefore, improvement of the operation speed of a p-channel MOS transistor using holes as carriers is an important task when designing a semiconductor integrated circuit device. Further, in the p-channel MOS transistor, it is known that the mobility of holes improves by applying uniaxial compressive strain to the channel region. Further, it has been pointed out in principle that, in such a p-channel MOS transistor, the larger the compressive strain generated in the channel region, the more the mobility of holes increases (Non-Patent Document 1).

Further, there has been studied a method in which, when forming a p-channel MOS transistor, recesses are formed in a source region and a drain region of a silicon substrate, and SiGe layers are epitaxially grown in the recesses. In this method, it is possible to increase a compressive strain by increasing Ge fraction in the epitaxially-grown SiGe layers.

However, when the Ge fraction is too high, a lattice mismatch between Si constituting the substrate and SiGe becomes too large, thereby generating dislocation in the SiGe layer. Such dislocation not only weakens the effect of the compressive strain induced by the SiGe layer, but also increases a leak current taking the dislocation as a path. As a result of this, the transistor performance is degraded.

In general, dislocation generated in a SiGe layer epitaxially grown on a silicon substrate occurs easier as the Ge fraction is higher or the thickness thereof is larger (Non-Patent Document 2). In theory, the limit of a film thickness over which the dislocation occurs is referred to as a critical film thickness, and for epitaxially growing a SiGe layer in which no dislocation exists, it is desirable that the thickness thereof is controlled to be equal to or smaller than the critical film thickness. However, in order to make the thickness of the SiGe layer equal to or smaller than the critical film thickness, there is a need that a recess is formed to be shallow, which makes it difficult to apply a sufficient compressive strain to the channel region.

Therefore, in a conventional art, in order to assure the normal operation, the Ge fraction is suppressed to be low. Accordingly, the mobility of carriers is suppressed to be lower than a theoretically possible level.

Patent Document 1: Japanese Laid-open Patent Publication No. 2006-186240
Patent Document 2: Japanese Laid-open Patent Publication No. 2006-278776
Patent Document 3: Japanese Laid-open Patent Publication No. 2006-332337
Non-Patent Document 1: K. Mistry, et al., 2004 Symposium on VLSI Technology, Digest of Technical Papers, pp. 50-51
Non-Patent Document 2: R. People, et al., Appl. Phys. Lett. Vol. 47(3), 1985

SUMMARY

A first semiconductor device is provided with a silicon substrate, a gate insulating film formed on the silicon substrate, and a gate electrode formed on the gate insulating film. Recesses are formed on both sides of the gate electrode and on a surface of the silicon substrate. There are further provided with a first semiconductor layer formed so as to cover a bottom surface and a side surface of each of the recesses and containing germanium, a second semiconductor layer formed on the first semiconductor layer and containing germanium at a lower content than a germanium content in the first semiconductor layer, and a third semiconductor layer formed on the second semiconductor layer and containing germanium.

A second semiconductor device is provided with a silicon substrate, a gate insulating film formed on the silicon substrate, and a gate electrode formed on the gate insulating film. Recesses are formed on both sides of the gate electrode and on a surface of the silicon substrate. There are further provided with a first semiconductor layer formed so as to cover a bottom surface and a side surface of each of the recesses and containing carbon, a second semiconductor layer formed on the first semiconductor layer and containing carbon at a lower content than a carbon content in the first semiconductor layer, and a third semiconductor layer formed on the second semiconductor layer and containing carbon.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF DRAWINGS

FIG. 3A to FIG. 3M are sectional views illustrating a manufacturing method of a semiconductor device according to a first embodiment in the order of steps;

FIG. 11 is a block diagram illustrating an example of a cellular phone.

DESCRIPTION OF EMBODIMENTS

Reference Example

Figure 1:
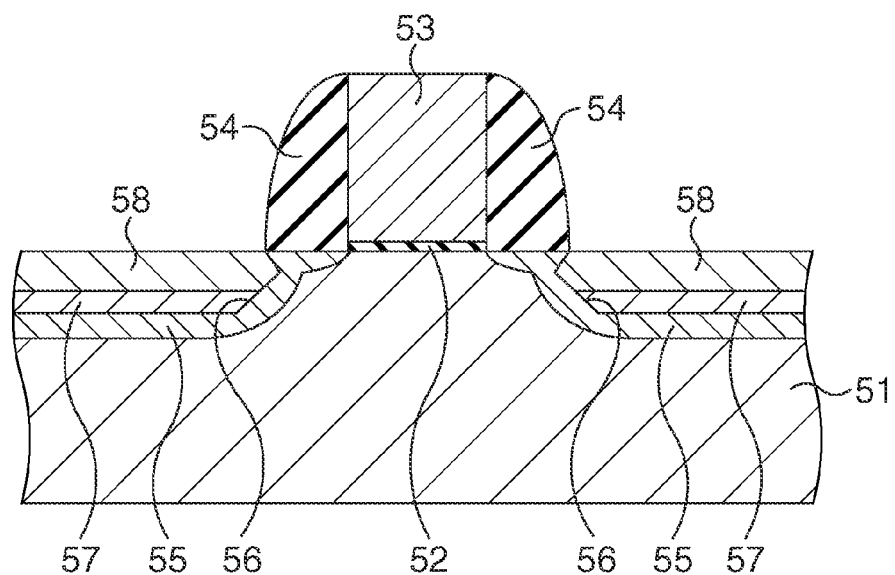
FIG. 1 is a sectional view illustrating a p-channel MOS transistor according to a reference example.

At first, a reference example will be described. The present inventors found that when forming a p-channel MOS transistor, a generation of dislocation can be suppressed while using deep recesses by varying Ge fraction in SiGe layers. A p-channel MOS transistor with such a structure is illustrated in FIG. 1.

In the p-channel MOS transistor, a gate insulating film 52 and a gate electrode 53 are formed on a silicon substrate 51 whose surface has a Miller index of (001). Further, on sides of the gate electrode 53, side walls 54 are formed. Further, recesses 56 are formed on lateral sides of the side walls 54 and on the surface of the silicon substrate 51. A bottom surface of the recess 56 has a Miller index of (001), and side surfaces on a channel region side of the recess 56 have a Miller index of <111>. Further, there are formed impurity diffused layers 55 that surround the recesses 56. In each of the recesses 56, a graded Ge fraction-SiGe layer 57 and a fixed Ge fraction-SiGe layer 58 are sequentially formed from bottom up. The layer 57 has Ge fraction that increases from a lower surface to an upper surface thereof, and the fixed SiGe layer 58 has Ge fraction that matches the Ge fraction in the upper surface of the graded SiGe layer 57.

Further, when forming such a p-channel MOS transistor, the graded SiGe layers 57 and the fixed SiGe layers 58 are epitaxially grown after the formation of the recesses 56. With the use of the method, since the graded SiGe layers 57 whose Ge fraction is gradually increased are epitaxially grown before the formation of the fixed SiGe layers 58 having high Ge fraction, even if the recesses 56 are formed deeply, dislocation hardly occurs in the fixed SiGe layers 58. Therefore, it is possible to make a tensile stress in a thickness direction strongly act on the channel region by forming the deep recesses 56. Further, since the fixed SiGe layers 58 position on sides of the channel region, it is also possible to make a compressive stress in a lateral direction strongly act on the channel region. Further, it can be considered that with the use of these two stresses, a compressive strain can be effectively generated in the channel region.

However, when the present inventors repeatedly conducted verification of a performance of the p-channel MOS transistor illustrated in FIG. 1, it became clear that although the p-channel MOS transistor obtains a higher mobility of carriers than a transistor using a conventional SiGe layer, the mobility is not the one with a level close to a desired level.

Figure 2:
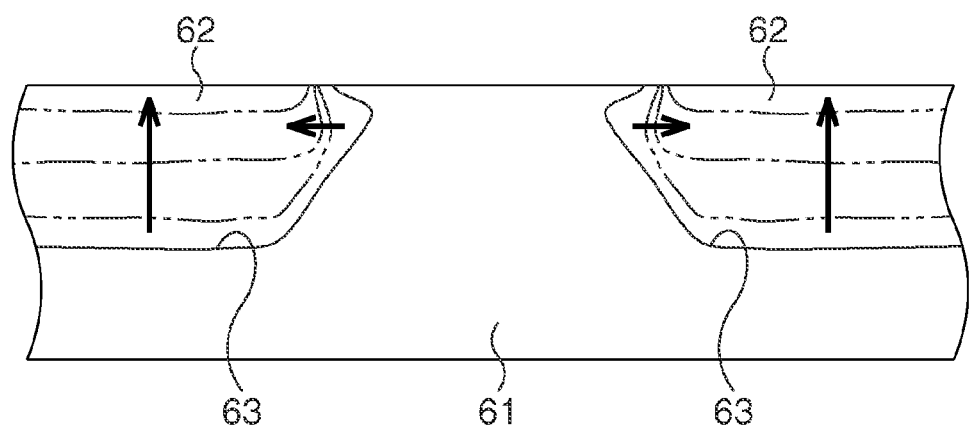
FIG. 2 is a view illustrating process of epitaxial growth of a SiGe layer.

Accordingly, the present inventors further conducted earnest studies to investigate the cause. As a result of this, it became clear that as illustrated in FIG. 2, when SiGe layers 62 are epitaxially grown in recesses 63 formed on a surface of a silicon substrate 61, initial layers of the SiGe layers 62 are formed not only on bottom surfaces but also on side surfaces of the recesses 63. Specifically, in the reference example illustrated in FIG. 1, although the graded SiGe layers 57 are intended to be formed only on bottom portions of the recesses 56, the graded SiGe layers 57 are actually formed also on the side surfaces on the channel side of the recesses 56. For this reason, the stresses from the fixed SiGe layers 58 do not sufficiently act on the channel region, and thus a desired compressive strain is not generated in the channel region.

Further, as illustrated in FIG. 2, it also became clear that, after the initial layers of the SiGe layers 62 are formed, the SiGe layers 62 do not grow in a lateral direction almost at all but they grow entirely in a thickness direction. This is because, although the initial layers are formed through absorption, they are selectively grown thereafter, so that the layers are affected by an etching operation using HCl contained in source gas, and further, since activation energy for an Si—Cl bond on the surface having a Miller index of <111> is large, it becomes difficult that $SiH_4$ and $GeH_4$ adhere to the initial layers.

Based on such a reference example, the present inventors have come up with the embodiments such as described below.

First Embodiment

Next, a first embodiment will be concretely explained with reference to the attached drawings. It should be noted that, for the sake of convenience, a structure of a semiconductor device is described together with a manufacturing method thereof. The first embodiment mainly relates to a p-channel MOS transistor. FIG. 3A to FIG. 3M are sectional views illustrating a manufacturing method of a semiconductor device according to the first embodiment in the order of steps.

First, as illustrated in FIG. 3A, an element isolation insulating film 12 that defines an nMOS region 1 and a pMOS region 2 is formed on a surface of a p-type silicon substrate 11 through an STI (Shallow Trench Isolation) method. The nMOS region 1 is a region on which an n-channel MOS transistor is going to be formed, and the pMOS region 2 is a region on which a p-channel MOS transistor is going to be formed. When forming the element isolation insulating film 12, a silicon oxide film having a thickness of 10 nm is first formed at 900° C. through dry oxidation, and a silicon nitride film having a thickness of about 112 nm is then formed at 750° C. through a CVD method using, for instance, $SiH_2Cl_2$ and $NH_3$. Thereafter, portions of the silicon oxide film and the silicon nitride film that position on a region on which the element isolation insulating film 12 is going to be formed are removed by etching. Subsequently, a trench is formed by performing etching on the silicon substrate 11 using remaining portions of the silicon oxide film and the silicon nitride film as a hard mask. Next, a silicon oxide film is formed in the trench and on the silicon nitride film through a plasma CVD method. After that, the silicon oxide film is removed through a CMP method until the silicon nitride film, which is positioned under the silicon oxide film, is exposed. Subsequently, the silicon nitride film is removed through wet processing using thermal phosphoric acid of 150° C., for instance. Further, the silicon oxide film positioned under the silicon nitride film is removed through wet processing using hydrofluoric acid. The element isolation insulating film 12 is formed as above.

After the formation of the element isolation insulating film 12, a p-well 13p is formed on the surface of the silicon substrate 11 in the nMOS region 1, and an n-well 13n is formed on the surface of the silicon substrate 11 in the pMOS region 2, as illustrated in FIG. 3A. Next, a silicon oxide film 35 having a thickness of about 1.5 nm is formed as a gate insulating film on the silicon substrate 11 through, for example, dry oxidation. Thereafter, a polycrystalline silicon film having a thickness of, for instance, about 100 nm is formed. Subsequently, an n-type impurity is introduced into the polycrystalline silicon film in the nMOS region 1, and a p-type impurity is introduced into the polycrystalline silicon film in the pMOS region 2. When introducing the n-type impurity, P (phosphor) ions are implanted at a dose amount of $8 \times 10^{15}$ cm$^{-2}$, for instance. Further, when introducing the p-type impurity, B (boron) ions are implanted at a dose amount of $6 \times 10^{15}$ cm$^{-2}$, for instance. Next, by performing an RTA (Rapid Thermal Annealing), these impurities are activated. As above, an n-type polycrystalline silicon film 14n and a p-type polycrystalline silicon film 14p are formed.

After that, a silicon oxide film having a thickness of, for instance, 30 nm is formed on the n-type polycrystalline silicon film 14n and the p-type polycrystalline silicon film 14p, and the silicon oxide film, the n-type polycrystalline silicon film 14n and the p-type polycrystalline silicon film 14p are patterned, as illustrated in FIG. 3B. As a result of this, gate electrodes on which silicon oxide films 15 are provided are formed.

Figure 3C:
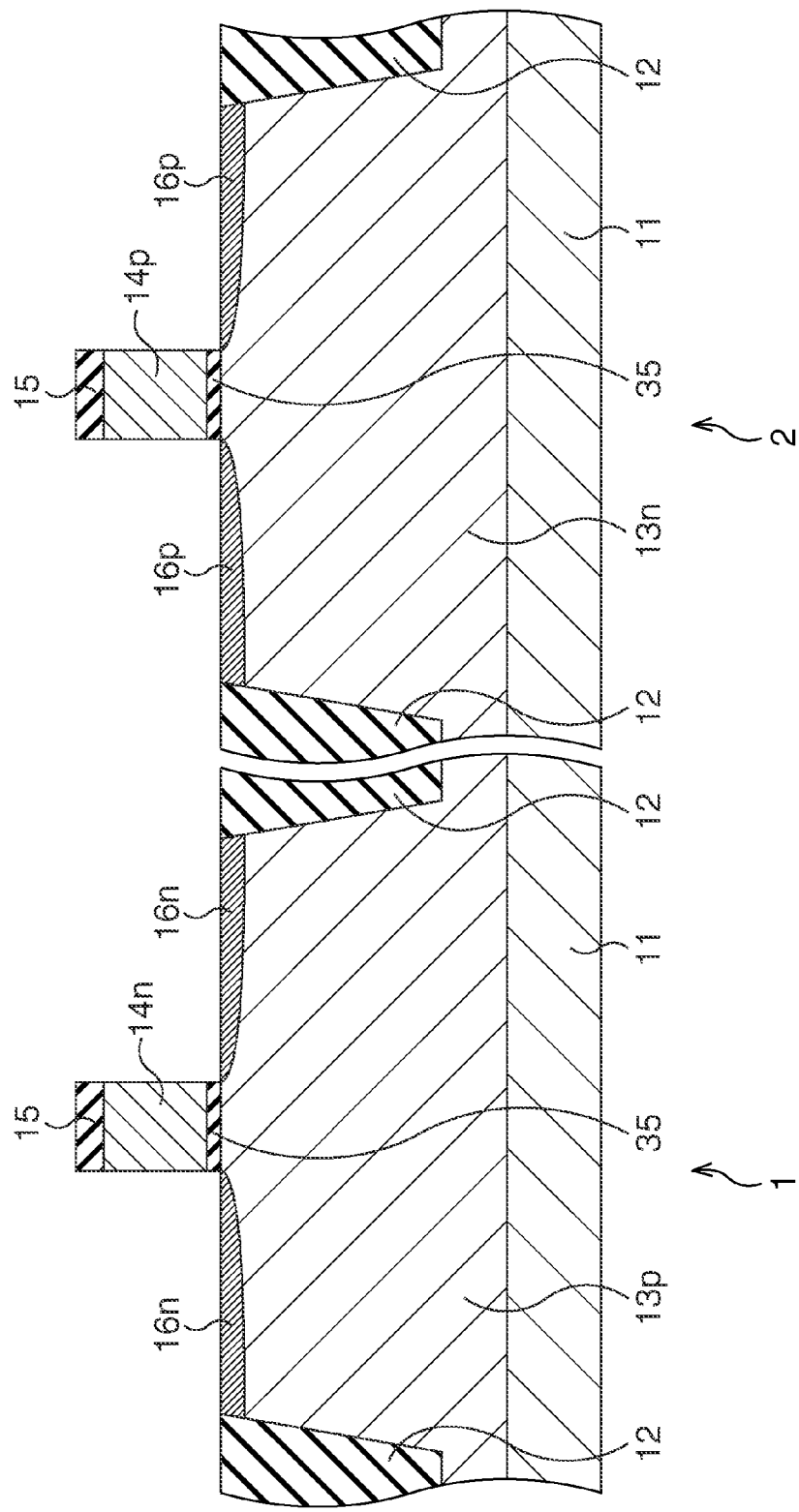

Subsequently, a photoresist film covering the pMOS region 2 is formed, and As (arsenic) ions are implanted at an acceleration energy of 3 keV and a dose amount of $1 \times 10^{15}$ cm$^{-2}$ using the photoresist film and the gate electrode in the nMOS region 1 as a mask. Further, a photoresist film covering the nMOS region 1 is formed, and B ions are implanted at an acceleration energy of 0.5 keV and a dose amount of $1 \times 10^{15}$ cm$^{-2}$ using the photoresist film and the gate electrode in the pMOS region 2 as a mask. As a result of the above, extension layers 16n are formed in the nMOS region 1, and extension layers 16p are formed in the pMOS region 2, as illustrated in FIG. 3C.

Further, by introducing the p-type impurity into the nMOS region 1 with using the photoresist film as it is that is used when forming the extension layers 16n, a p-type pocket layer is also formed. In like manner, by introducing the n-type impurity into the pMOS region 2 with using the photoresist film as it is that is used when forming the extension layers 16p, an n-type pocket layer is also formed. When introducing the p-type impurity, B ions, for instance, are implanted at an acceleration energy of 10 keV and a dose amount of $1 \times 10^{13}$ cm$^{-2}$. When introducing the n-type impurity, As ions, for instance, are implanted at an acceleration energy of 10 keV and a dose amount of $2 \times 10^{13}$ cm$^{-2}$.

Figure 3D:
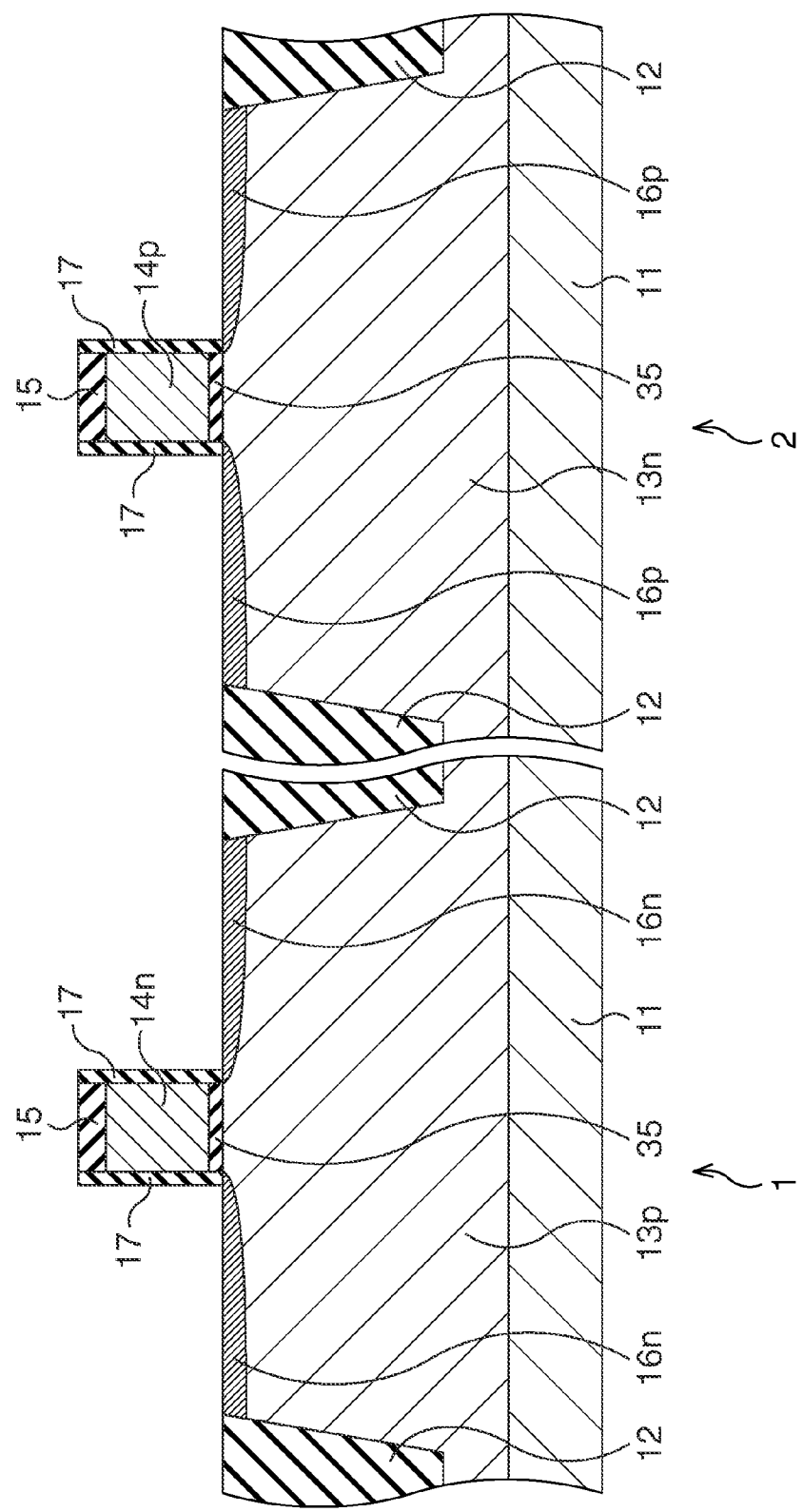

Subsequently, a silicon nitride film is formed on the entire surface, and etch back is performed on the film, thereby forming silicon nitride films 17 each having a thickness of, for instance, 20 nm, on sides of the gate electrodes, as illustrated in FIG. 3D.

Figure 3E:
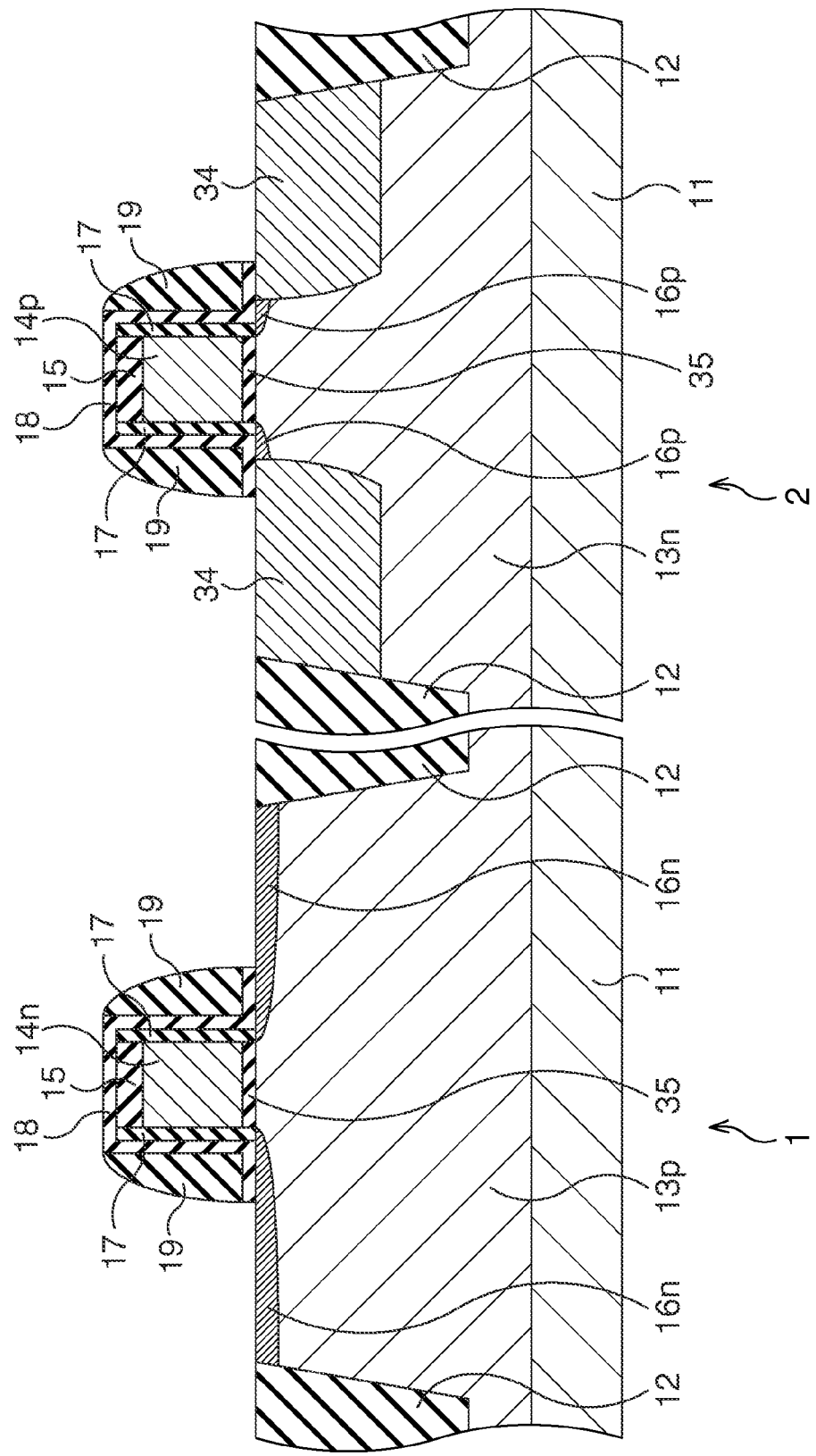

Thereafter, a silicon oxide film and a silicon nitride film are formed on the entire surface, and etch back is performed on these films, to thereby form silicon oxide films 18 that cover the sides and above the gate electrodes and silicon nitride films 19 on sides of the silicon oxide films 18, as illustrated in FIG. 3E. A thickness of the silicon oxide film 18 is set to 5 nm or less, for instance, and a thickness of the silicon nitride film 19 is set to about 20 nm, for instance. Note that the silicon oxide films 18 are interposed between the silicon nitride films 19 and the silicon substrate 11. Subsequently, a photoresist film covering the nMOS region 1 is formed, and B ions are implanted at an acceleration energy of 10 keV and a dose amount of $3 \times 10^{13}$ cm$^{-2}$ using the photoresist film and the gate electrode in the pMOS region 2 as a mask. As a result of this, p-type impurity diffused layers 34 deeper than the extension layers 16p are formed in the pMOS region 2.

Figure 3F:
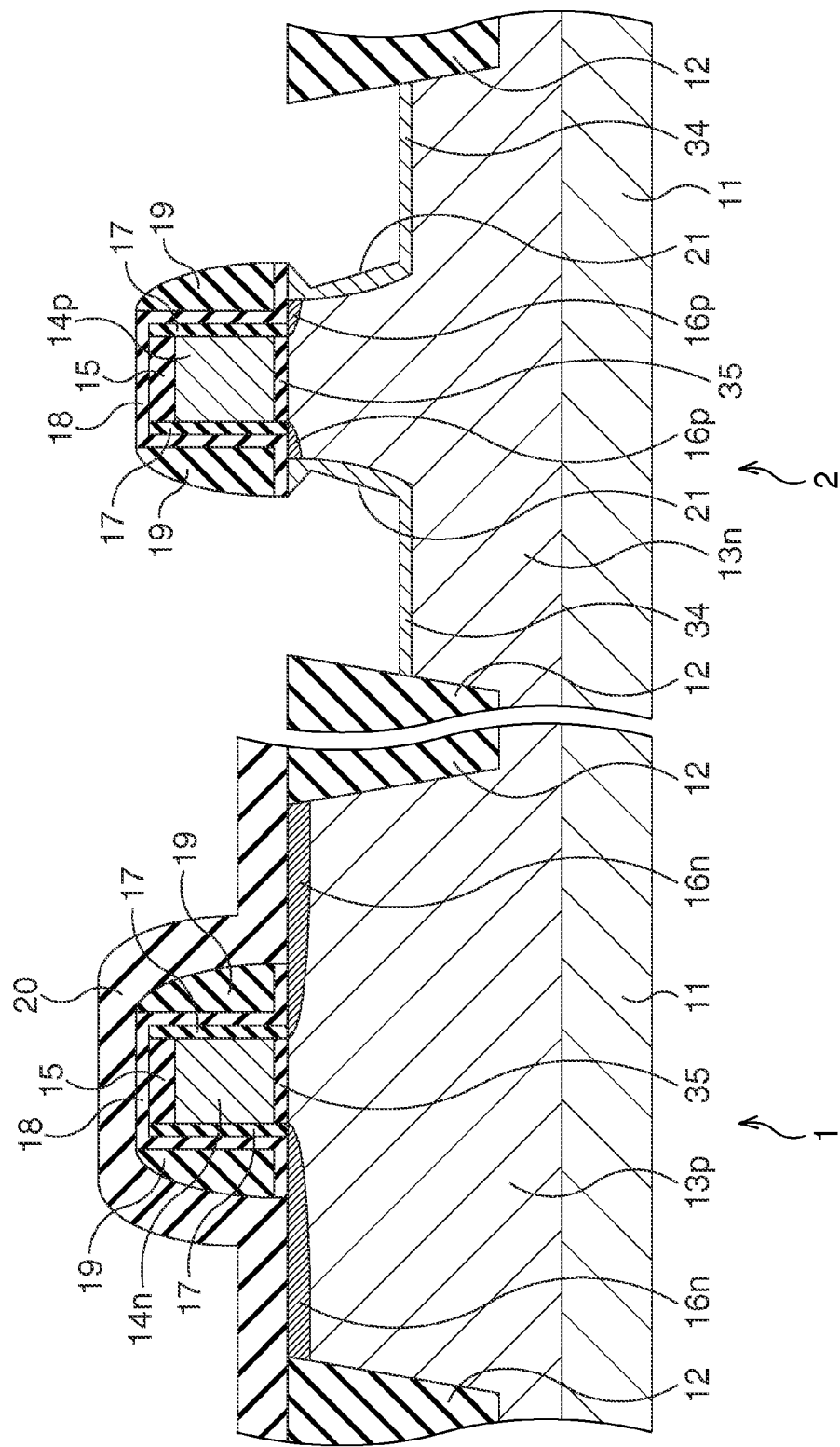

Next, as illustrated in FIG. 3F, a silicon oxide film 20 covering the nMOS region 1 is formed, and etching is performed on the silicon substrate 11 in the pMOS region 2 using the silicon oxide film 20 as a hard mask, thereby forming recesses 21 that overlap parts of the p-type impurity diffused layers 34. A depth of the recess 21 is set to, for instance, about 50 nm. Note that when forming the recesses 21, dry etching is first performed, and wet etching is then performed using tetramethylammonium hydroxide (TMAH) aqueous solution, in which an etching amount at the time of the wet etching is set to, for instance, about 10 nm. As a result of this, a bottom surface of the recess 21 has a Miller index of (001), and a side surface of the recess 21 has a Miller index of <111>.

After that, the silicon substrate 11 is put into a pressure-reduced CVD reactor in which hydrogen gas and inert gas (nitrogen gas, argon gas, helium gas, or the like) are filled and the pressure is kept between 5 Pa and 1330 Pa, and the substrate 11 is heated to between 400° C. and 550° C. in a hydrogen atmosphere. Further, the substrate is retained for approximately 60 minutes at the maximum under the condition, so that hydrogen baking is performed.

Subsequently, while keeping the pressure and the temperature, in the pressure-reduced CVD reactor, mixed gas of $SiH_4$, HCl and $GeH_4$ is supplied in addition to the aforementioned hydrogen gas and/or the inert gas. $SiH_4$ is source gas for Si, and $GeH_4$ is source gas for Ge. Further, HCl is gas which improves selectivity of growing direction. Note that the partial pressure of $SiH_4$ is fixed in the range of 1 Pa to 10 Pa, and the partial pressure of HCl is fixed in the range of 1 Pa to 10 Pa. Further, the partial pressure of $GeH_4$ is set to 10 Pa. Under such a condition, an $Si_{0.76}Ge_{0.24}$ layer having a thickness of 5 nm is formed through epitaxial growth. Specifically, a SiGe layer 22 whose Ge fraction is fixed to 24% is formed on the bottom surface of each of the recesses 21 as a first semiconductor layer, as illustrated in FIG. 3G. At this time, as also apparent from an analysis result illustrated in FIG. 2, the SiGe layer 22 is formed also on the side surface of the recess 21. Note that a growth temperature of the SiGe layer 22 is preferably set to 600° C. or lower.

Figure 3H:
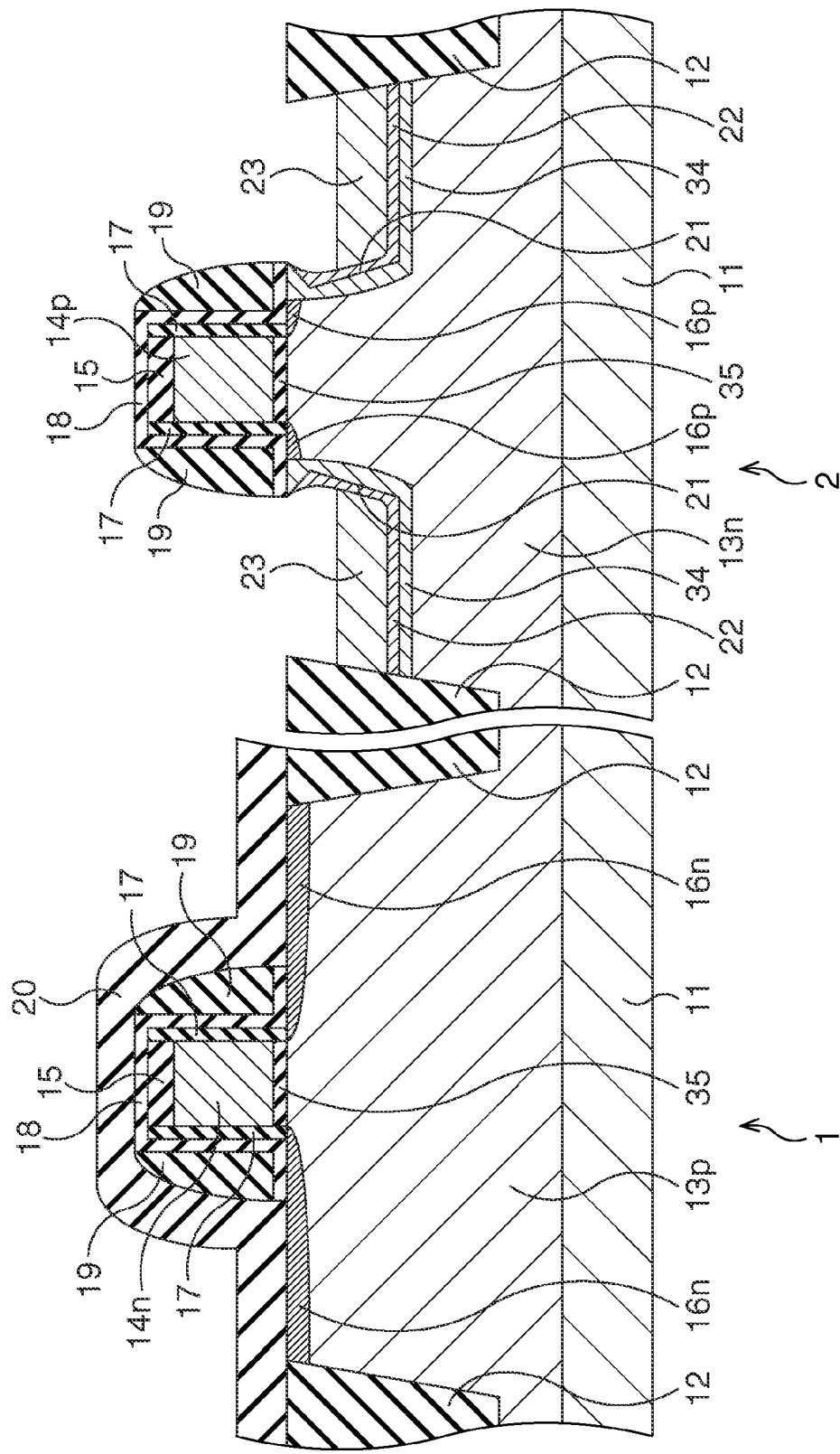

Next, while keeping the pressure and the temperature, $B_2H_6$ is also supplied into the pressure-reduced CVD reactor. $B_2H_6$ is source gas for B (impurity). The partial pressure of $B_2H_6$ is fixed in the range of $1 \times 10^{-5}$ Pa to $1 \times 10^{-3}$ Pa. Further, simultaneously at the same time as the supply of the gas, the partial pressure of $GeH_4$ is temporarily decreased to 0 Pa, and right after that, the partial pressure of $GeH_4$ is increased to within the range of 0.1 Pa to 10 Pa in proportion to the elapsed time. Under such a condition, a SiGe layer 23 having a thickness of about 20 nm and having a Ge fraction varying continuously from 0% to 25%, is formed as a second semiconductor layer on each of the SiGe layers 22 through epitaxial growth, as illustrated in FIG. 3H. At this time, as also apparent from the analysis result illustrated in FIG. 2, the SiGe layer 23 does not grow in a lateral direction almost at all.

Figure 3I:
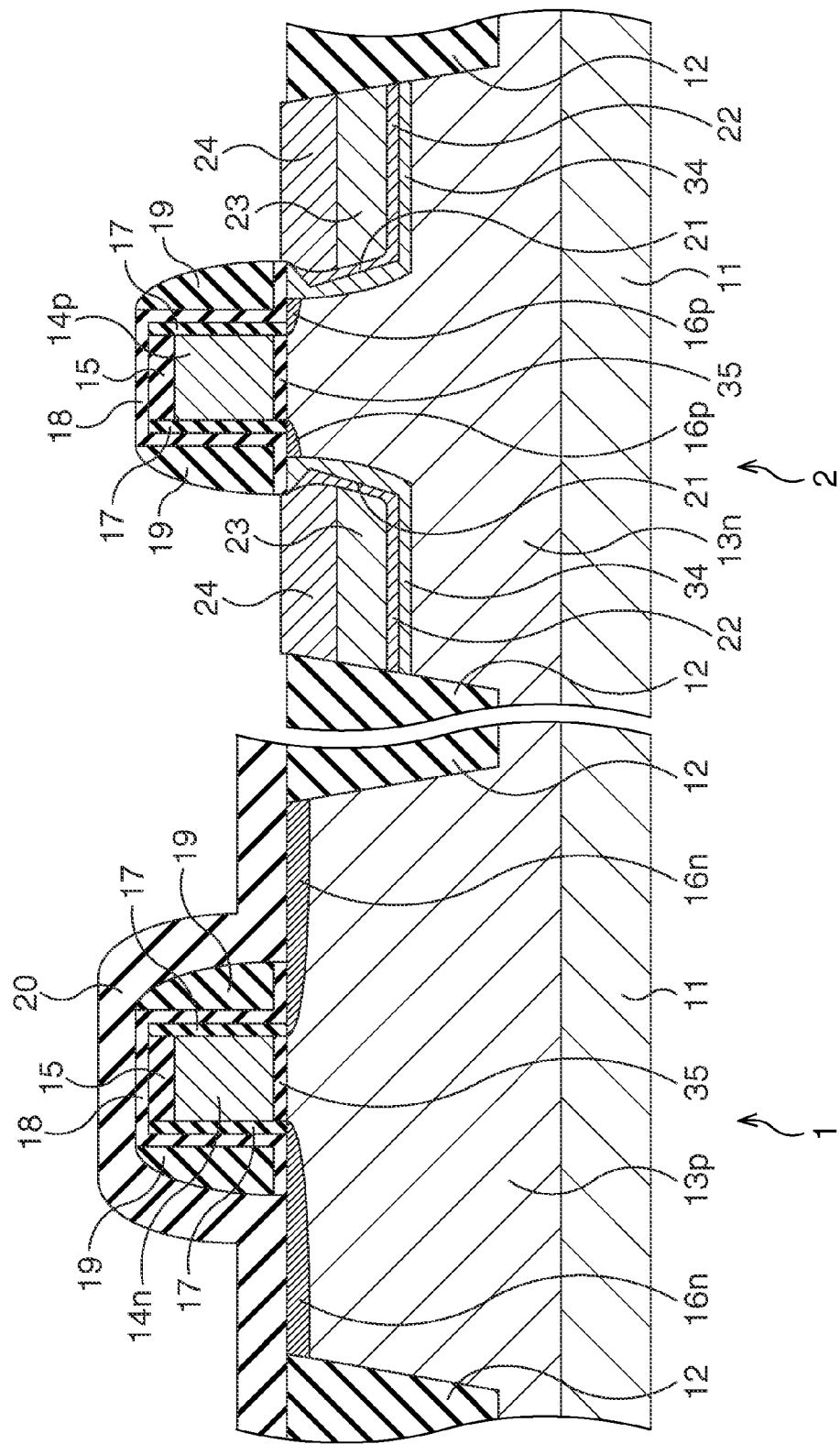

Thereafter, by keeping the partial pressure of the respective gases, the pressure and the temperature, a SiGe layer 24 having a thickness of about 30 nm and having a Ge fraction fixed to 25% is formed as a third semiconductor layer on each of the SiGe layers 23 through epitaxial growth, as illustrated in FIG. 3I. A lower surface of the SiGe layer 24 positions below an interface between the channel region and the gate insulating film 35, and an upper surface of the SiGe layer 24 positions above the interface. Specifically, the SiGe layers 24 position on sides of the interface between the channel region and the gate insulating film 35.

Figure 3J:
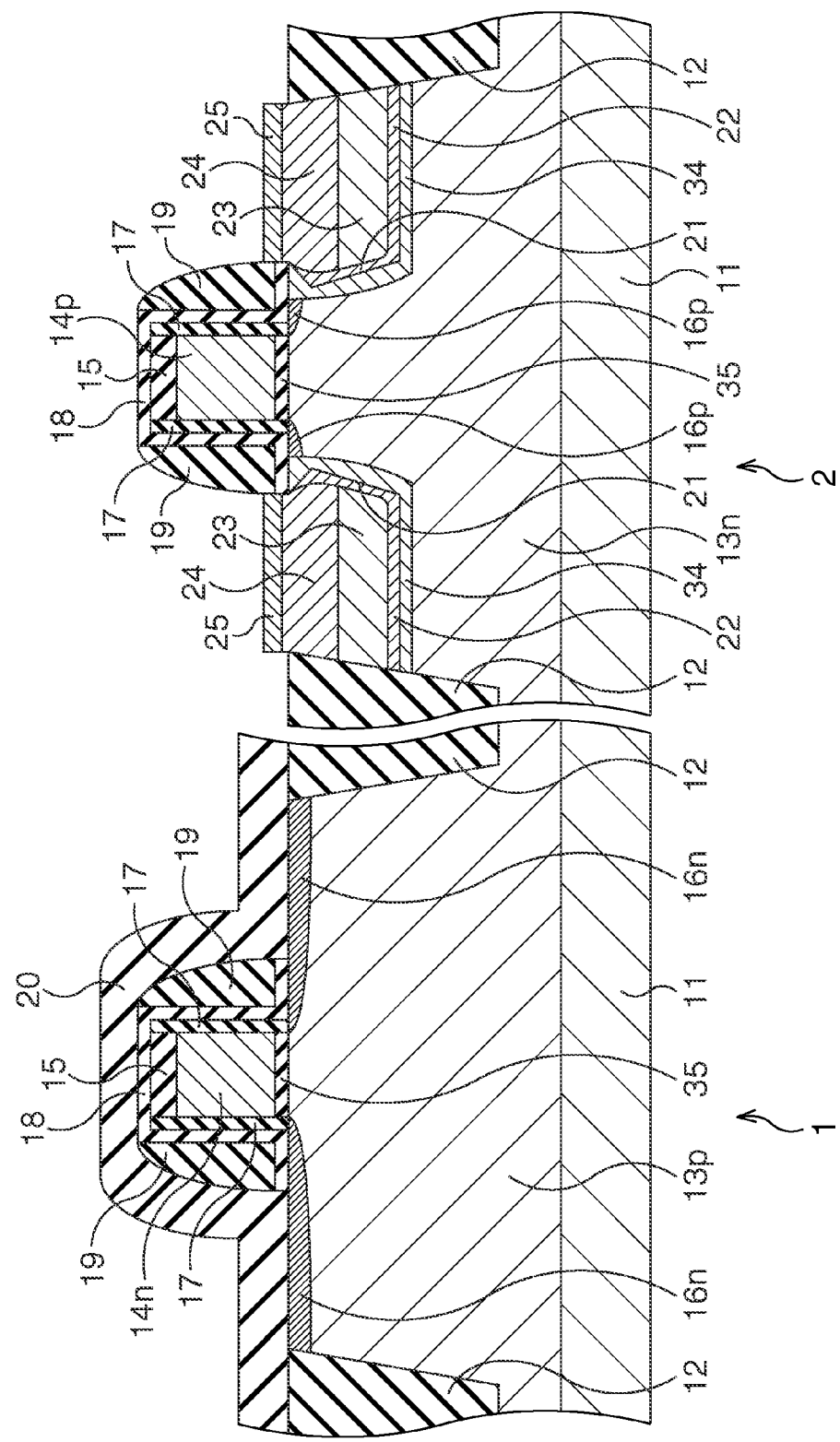

Subsequently, the supply of GeH$_4$ is stopped while keeping the pressure and the temperature. Under such a condition, a silicon layer 25 having a thickness of about 5 nm to 10 nm is formed on each of the SiGe layers 24 through epitaxial growth, as illustrated in FIG. 3J.

Figure 3K:
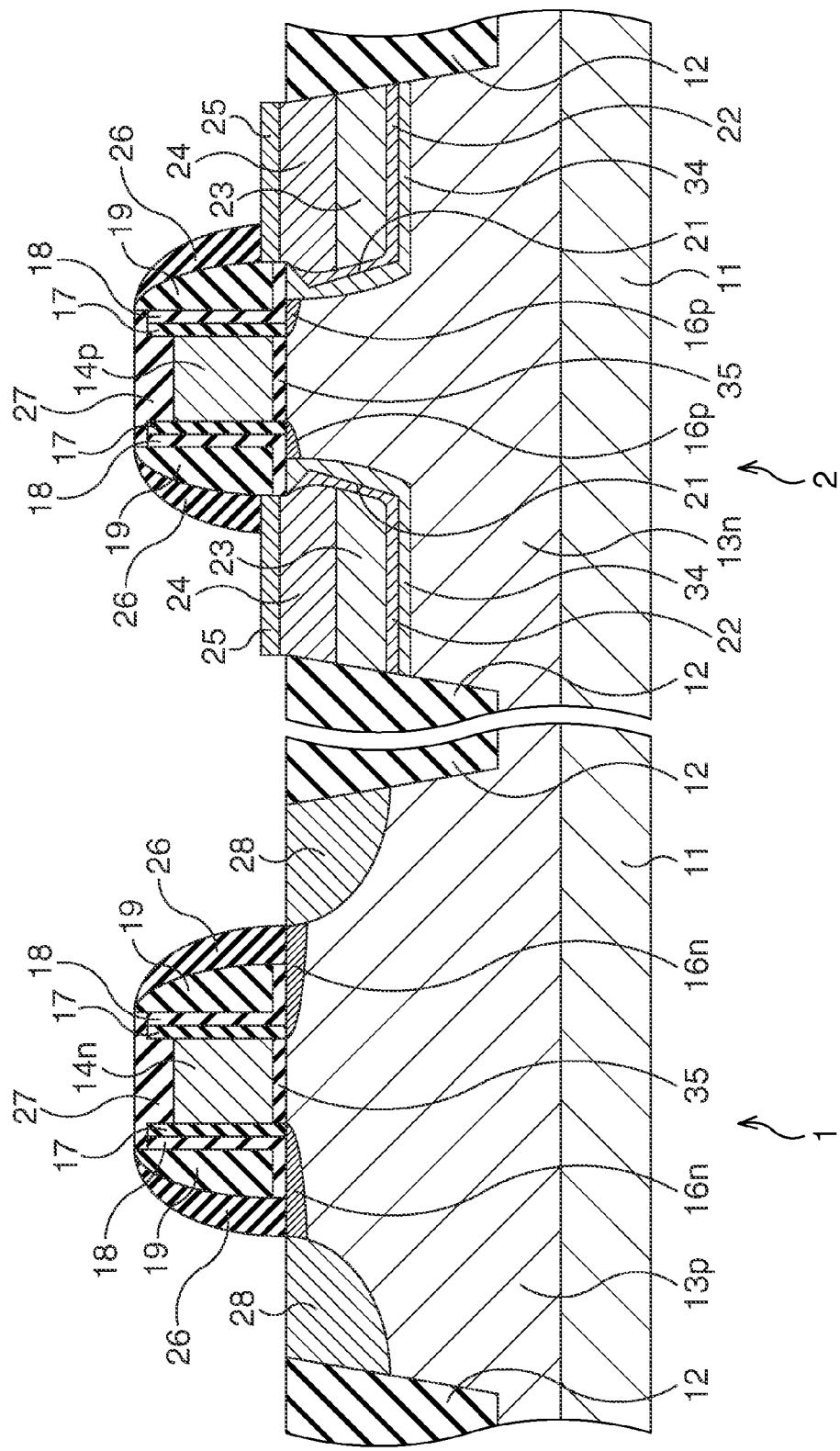

Next, the silicon oxide film 20 is removed, as illustrated in FIG. 3K. At this time, the silicon oxide films 15 and parts of the silicon oxide films 18 are also removed. Thereafter, a silicon oxide film having a thickness of about 20 nm is formed on the entire surface at 500° C. or lower, and etch back is performed on the film, thereby forming side walls 26. At this time, a silicon oxide film 27 is formed on each of the gate electrodes. Subsequently, a photoresist film covering the pMOS region 2 is formed, and P ions are implanted at an acceleration energy of 6.0 keV and a dose amount of $8 \times 10^{15}$ cm$^{-2}$ using the photoresist film, the gate electrode and the side walls 26 in the nMOS region 1 as a mask. Further, by performing a very short-time annealing (spike annealing, for instance) in which the maximum temperature is set to 950° C. or lower, the P ions are activated. As a result of this, n-type impurity diffused layers 28 are formed in the nMOS region 1.

Figure 3L:
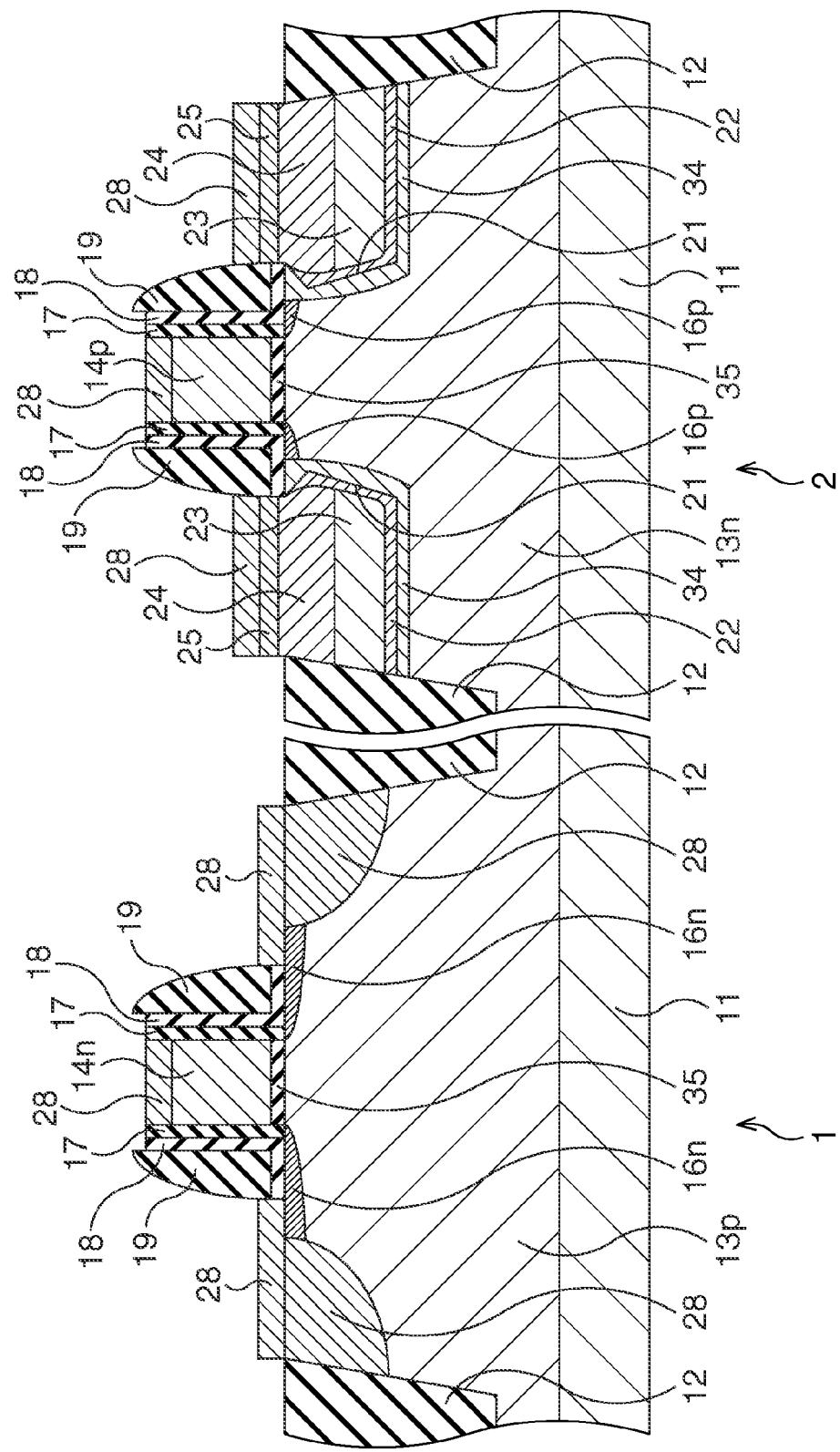

Next, the side walls 26 and the silicon oxide films 27 are removed, an Ni or Ni alloy film having a thickness of about 10 nm is formed on the entire surface, and RTA is performed at, for instance, around 300° C. (Less than 10% fraction Platinum is desired to be contained in as-sputterd Ni layer) As a result of this, silicide layers 28 are formed on the gate electrodes, on the silicon layers 25, and on the n-type impurity diffused layers 28, as illustrated in FIG. 3L. Subsequently, the unreacted Ni or Ni alloy film is removed by persulfuric acid treatment. After that, in order to realize a further reduction in resistance of the silicide layers 28, heat treatment is performed at 400° C. to 500° C.

Next, as illustrated in FIG. 3M, an interlayer insulating film 31 is formed on the entire surface, and contact holes that reach the silicide layers 28 are formed in the interlayer insulating film 31. Subsequently, contact plugs 32 are formed in the contact holes, and wirings which are brought into contact with the contact plugs 32 are formed on the interlayer insulating film 31. Thereafter, interlayer insulating films, wirings, and so forth of upper layers are further formed to complete the semiconductor device.

According to the first embodiment as described above, since the SiGe layers 22 having high Ge fraction are formed before the formation of the SiGe layers 23 having rather low Ge fraction, the growth of the SiGe layers 23 on the side surfaces of the recesses 21 is suppressed, and the sides of the channel region are almost completely occupied by the SiGe layers 22 and 24. Further, the Ge fraction in the SiGe layers 22 and 24 is rather high, so that it is possible to effectively generate the compressive strain in the channel region in the p-channel MOS transistor.

Note that it is preferable to set a range of B content in the SiGe layer 23, the SiGe layer 24 and the silicon layer 25 so that a resistivity of a stack of these layers becomes about 1 mΩ·cm.

Further, the Ge fraction in the SiGe layers 22 and 24 is not particularly limited, and is 25% to 35%, for instance. Further, the Ge fraction in the upper surface of the SiGe layer 23 is also not particularly limited, and is 25% to 35%, for instance, and the Ge fraction in the SiGe layer 23 is also not particularly limited, and is 20% or less, for instance. Although the Ge fraction in the SiGe layer 23 does not have to be graded, it may be lower than the Ge fraction in the SiGe layer 22 and is preferably lower than the Ge fraction in the SiGe layer 24.

Further, although the depth of the recess 21 and the thickness of the respective SiGe layers are not particularly limited, the thickness of the SiGe layer 22 is preferably 30 nm or less and more preferably 5 nm or less. Further, it is also possible that the upper surface of the SiGe layer 24 is positioned at the same height as the interface between the silicon substrate 11 and the gate insulating film 35.

Next, explanation will be made on an analysis regarding a distribution of strains using a FEM (Finite Element Method) conducted by the present inventors.

Figure 4:
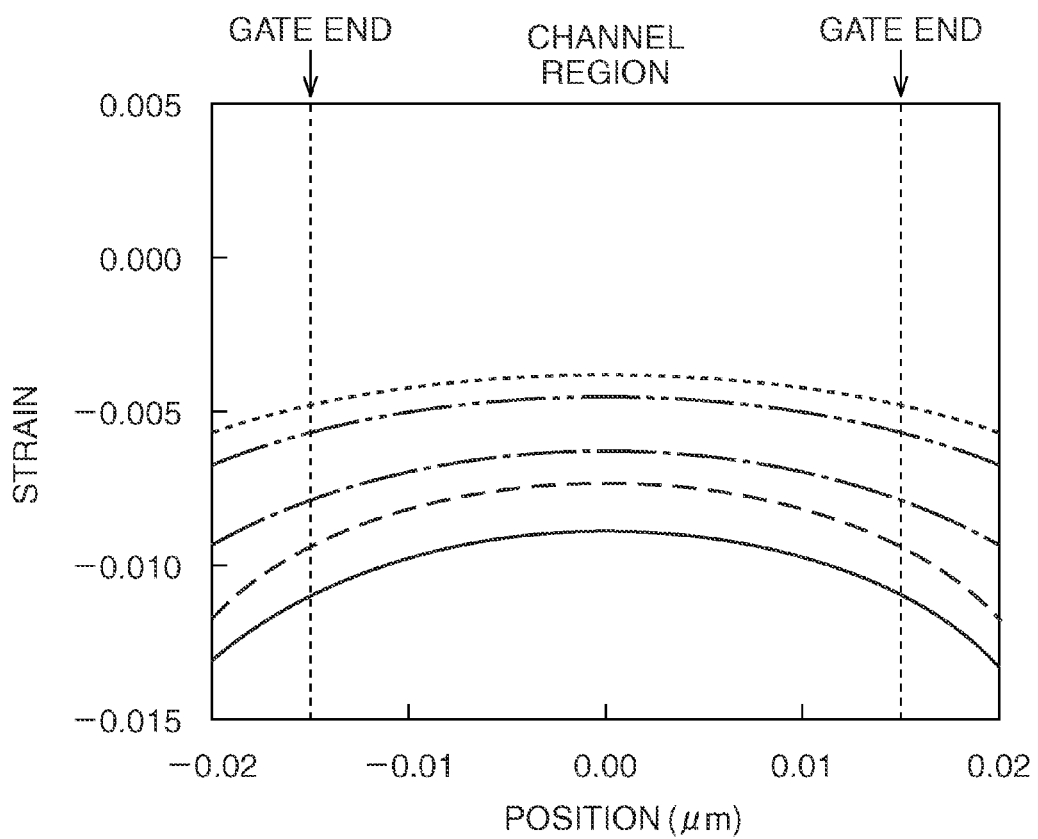
FIG. 4 is a graph illustrating a result of analysis conducted by the present inventors.

In the analysis, a strain in the channel region and in the vicinity thereof in the p-channel MOS transistor formed through the method according to the aforementioned embodiment was calculated (example). This "strain" refers to the lateral channel strain in the direction of Source-Drain. Note that it was set such that the Ge fraction in the upper surface of the SiGe layer 23 and the Ge fraction in the SiGe layer 24 were 28%, and the Ge fraction in the lower surface of the SiGe layer 23 was 15%. Further, for reference, a strain when the formation of SiGe layers 22 was omitted was calculated (comparative example 1). Further, three types of strains when only SiGe layers whose Ge fraction was fixed to 15% (comparative example 2), 18% (comparative example 3) or 24% (comparative example 4) were formed in recesses were also calculated. FIG. 4 illustrates the results. In FIG. 4, a solid line indicates a distribution of strain of the transistor according to the aforementioned embodiment, and a broken line indicates a distribution of strain when the formation of SiGe layers 22 was omitted. Further, a dotted line, a two-dot chain line and one-dot chain line indicate distributions of strains when only the SiGe layers whose Ge fraction were fixed to 15%, 18% and 24%, respectively, were formed. A horizontal axis indicates a position in a lateral direction in which a center of the channel region is set as a reference.

As illustrated in FIG. 4, there is obtained an analysis result indicating that the largest compressive strain could be obtained in the p-channel MOS transistor according to the aforementioned embodiment. Further, when calculating, based on the analysis result, an increasing ratio of an on-current in which the comparative example 3 was set as a reference, there was obtained a result indicating that the increasing ratio twice the increasing rate in the comparative example 1 could be obtained in the example.

Figure 5:
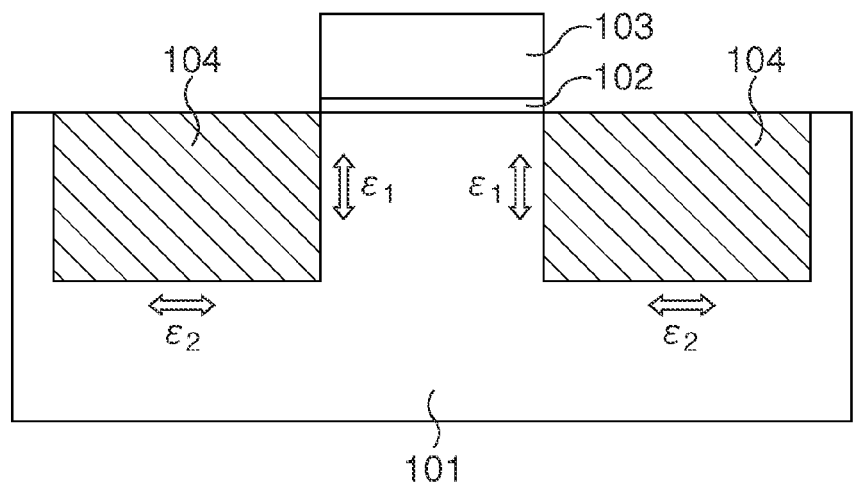
FIG. 5 is a view illustrating a p-channel MOS transistor being an object of the analysis.
Figure 6A:
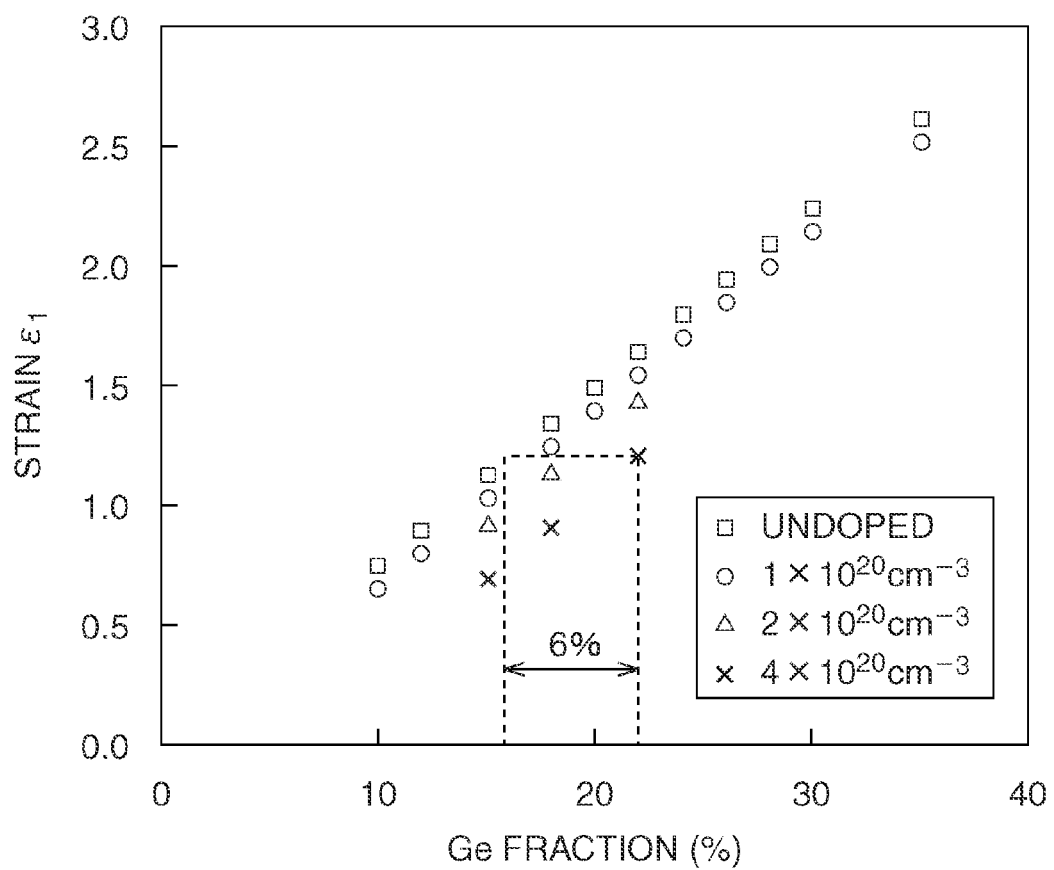
FIG. 6A is a graph illustrating a relation between B contents and a strain $\epsilon_1$.
Figure 6B:
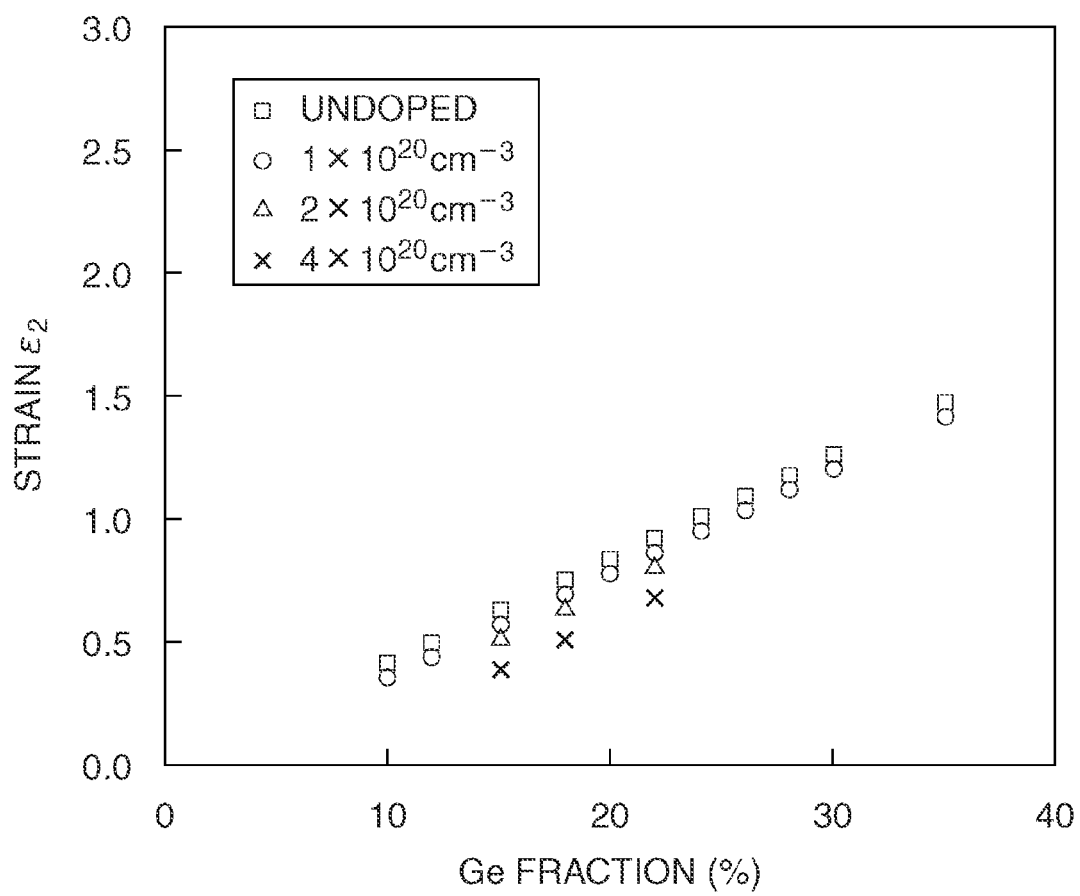
FIG. 6B is a graph illustrating a relation between B contents and a strain $\epsilon_2$.
Figure 7:
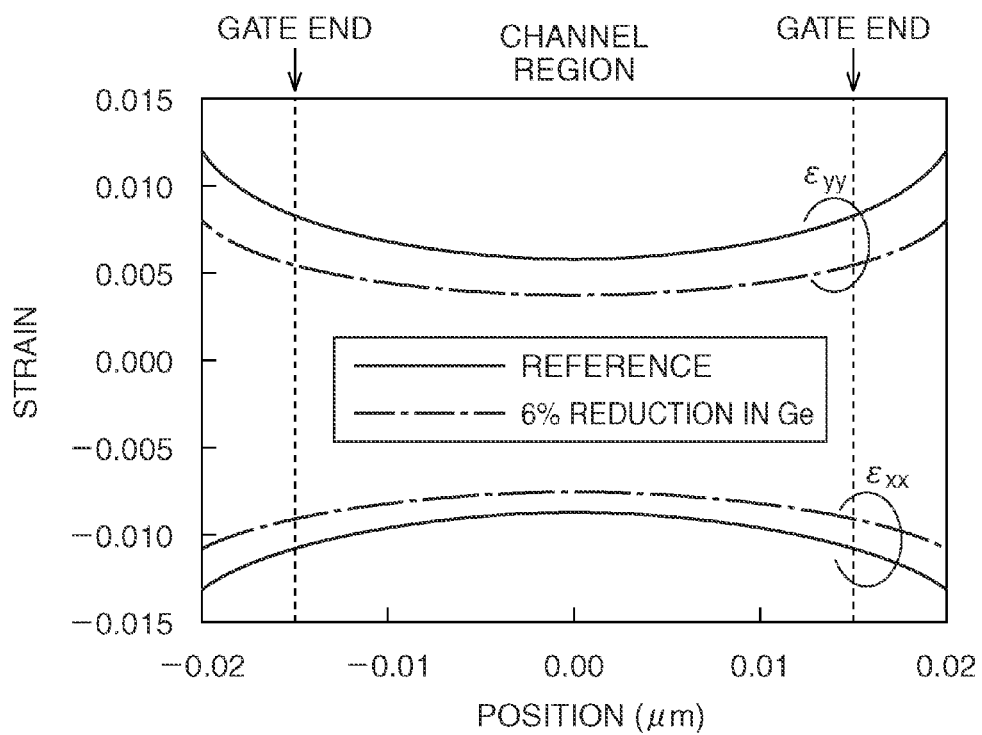
FIG. 7 is a graph illustrating a relation between Ge fraction and strains.

Further, it was clarified by the present inventors that the strain of the silicon substrate generated by the SiGe layers embedded in the recesses is affected by not only the Ge fraction but also a B content. The next "strain" calculation is based on the technical paper D. De. Salvador, et al., Phys. Rev. B61, 13005(2000). Concretely, it was found that the strain is further relaxed as the B content becomes higher. For example, regarding a p-channel MOS transistor having a silicon substrate 101, a gate insulating film 102, a gate electrode 103 and SiGe layers 104 illustrated in FIG. 5, when Ge fraction in the SiGe layers 104 is varied, strains $\epsilon_1$ and $\epsilon_2$ indicate tendencies as illustrated in FIG. 6A and FIG. 6B. The strain $\epsilon_1$ is a strain in a thickness direction generated in the silicon substrate 101 at an interface between a side surface of the SiGe layer 104 and the silicon substrate 101, and the strain $\epsilon_2$ is a strain in a lateral direction generated in the silicon substrate 101 at an interface between a bottom surface of the SiGe layer 104 and the silicon substrate 101. As illustrated in FIG. 6A and FIG. 6B, the strains $\epsilon_1$ and $\epsilon_2$ become smaller as the B content becomes higher. Further, as illustrated in FIG. 6A, when a case in which B is not contained and a case in which the B content is $4\times10^{20}$ cm$^{-3}$ are compared, the Ge fraction required for generating the strains $\epsilon_1$ with the same magnitude differ by about 6%. Specifically, if focusing attention on the magnitude of the strain, to add B by $2\times10^{20}$ cm$^{-3}$ corresponds to decrease the Ge fraction by about 6%. Accordingly, when the Ge fraction is decreased by 6% from SiGe layers that generate strains indicated by a solid line in FIG. 7, only strains indicated by one-dot chain line are generated. Also from the above description, it is apparent that the strain is largely relaxed as the B content becomes higher. Note that in FIG. 7, $\epsilon_{xx}$ indicates a strain in a lateral direction generated in a channel region (compressive strain), and $\epsilon_{yy}$ indicates a strain in a thickness direction generated in the channel region (tensile strain).

Figure 8:
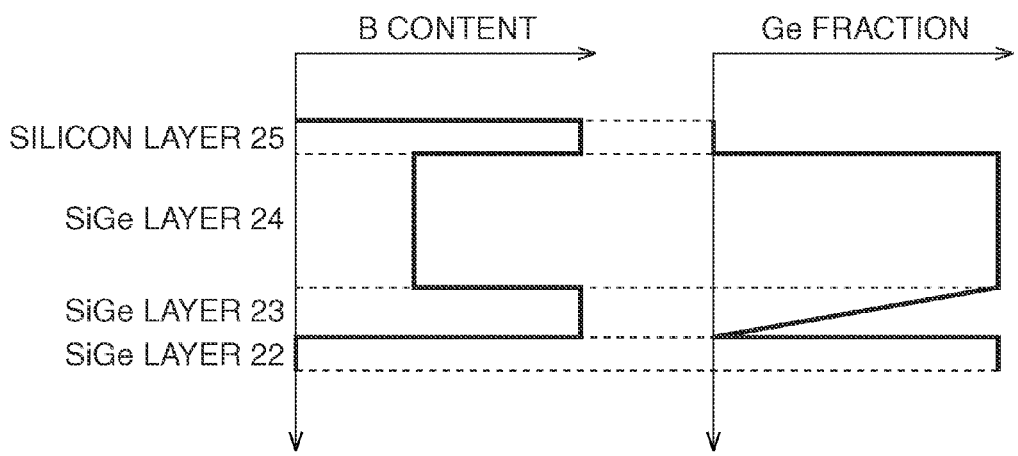
FIG. 8 is a view illustrating a preferred distribution of B contents.

Accordingly, it is preferable that the B content is not set equivalently among the SiGe layer 23, the SiGe layer 24 and the silicon layer 25, but is adjusted in accordance with a required characteristic. For instance, as illustrated in FIG. 8, in the SiGe layer 24 having high Ge fraction, the B content is set to a low content of $1\times10^{20}$ cm$^{-3}$, and in the SiGe layers 23 and 25 sandwiching the SiGe layer 24, the B content is set to a high content of $5\times10^{20}$ cm$^{-3}$ to $1\times10^{21}$ cm$^{-3}$. Such adjustment can be easily performed by controlling the partial pressure of the source gas for B ($B_2H_6$, for instance) supplied into the pressure-reduced CVD reactor.

Second Embodiment

Next, a second embodiment will be concretely explained with reference to the attached drawings. Here, for the sake of convenience, a structure of a semiconductor device is described together with a manufacturing method thereof. The second embodiment mainly relates to an n-channel MOS transistor. In the n-channel MOS transistor, it is preferable to generate a tensile strain in a lateral direction in a channel region. To achieve this, it is efficient to form SiC layers in recesses, for instance. Further, when forming the SiC layers, by appropriately controlling a C content in the SiC layers, the same effect as that of the first embodiment can be obtained also in the n-channel MOS transistor. FIG. 9A to FIG. 9E are sectional views illustrating a manufacturing method of a semiconductor device according to the second embodiment in the order of steps.

Figure 9A:
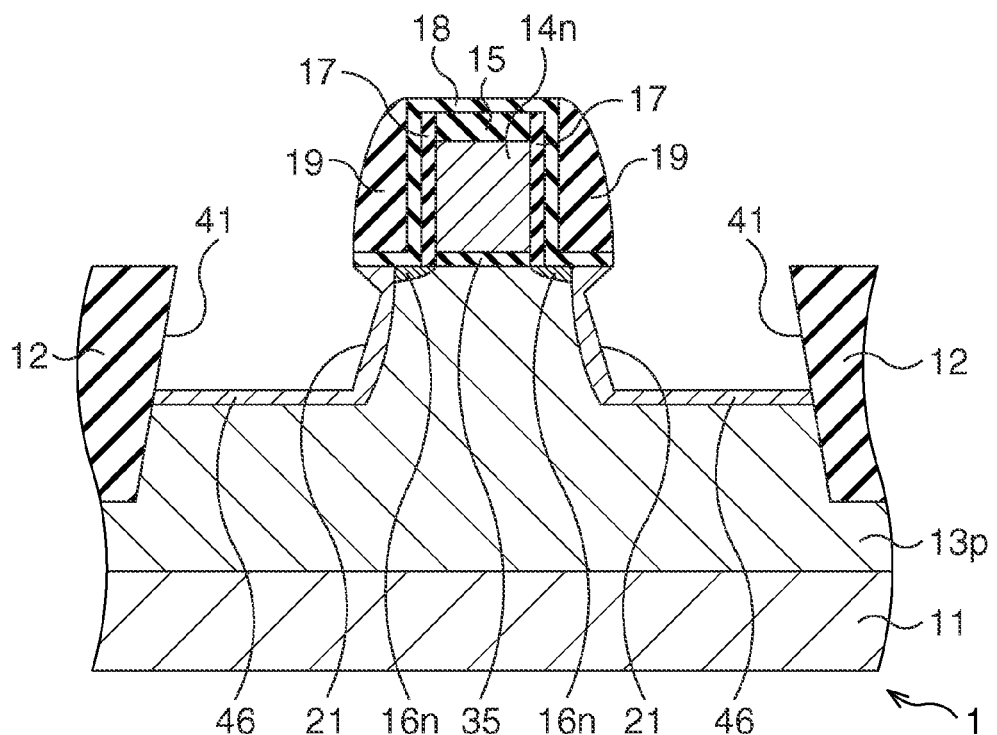
FIG. 9A to FIG. 9E are sectional views illustrating a manufacturing method of a semiconductor device according to a second embodiment in the order of steps.

First, similar to the first embodiment, processing up to the formation of the silicon oxide films 18 and the silicon nitride films 19 is performed (FIG. 3E). Next, as illustrated in FIG. 9A, n-type impurity diffused layers 46 deeper than the extension layers 16n are formed in the nMOS region 1. Thereafter, a silicon oxide film covering the pMOS region 2 is formed, and etching is performed on the silicon substrate 11 in the nMOS region 1 with using the silicon oxide film as a hard mask, thereby forming recesses 41 that overlap parts of the n-type impurity diffused layers 46, through the same method as the method of forming the recesses 21.

Figure 9B:
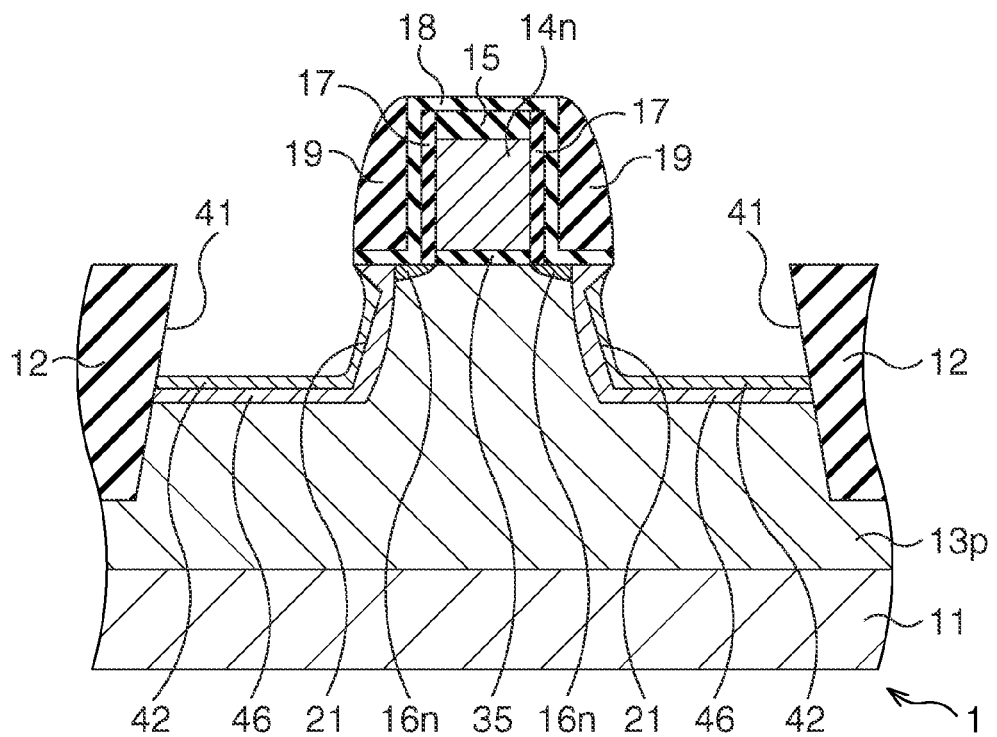

Subsequently, a SiC layer 42 having a thickness of 5 nm and having a C content of 2.0% is formed as a first semiconductor layer on a bottom surface of each of the recesses 41 through epitaxial growth, as illustrated in FIG. 9B. At this time, as also apparent from the analysis result illustrated in FIG. 2, the SiC layer 42 is formed also on the side surface of the recess 41.

Figure 9C:
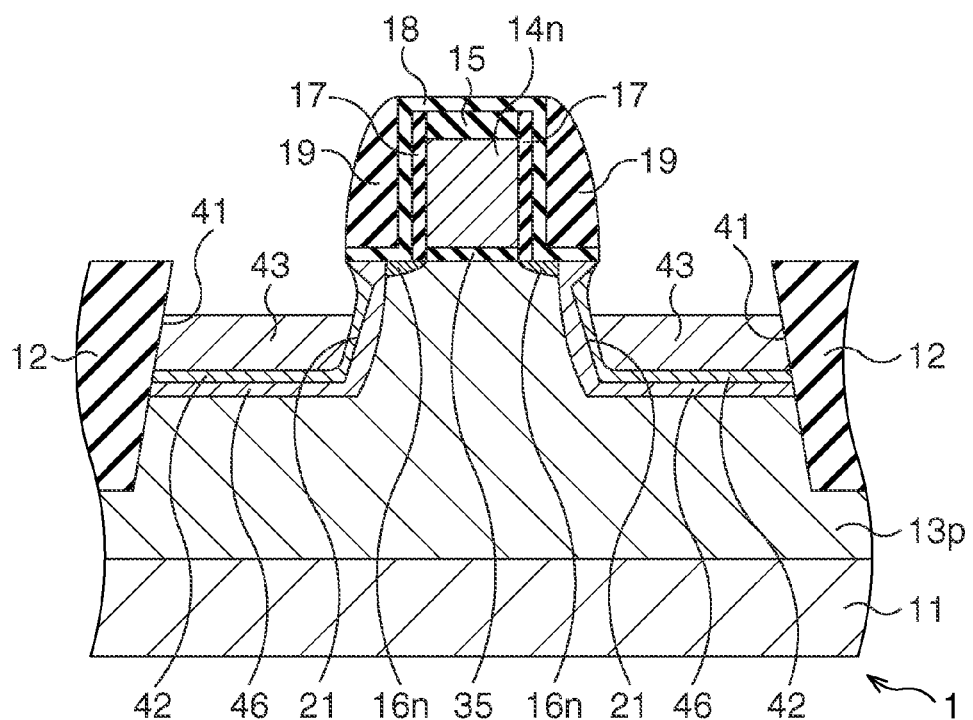

Next, a SiC layer 43 having a thickness of about 20 nm and having a C content varying continuously from 0% to 2%, is formed as a second semiconductor layer on each of the SiC layers 42 through epitaxial growth, as illustrated in FIG. 9C. At this time, as also apparent from the analysis result illustrated in FIG. 2, the SiC layer 43 does not grow in a lateral direction almost at all.

Figure 9D:
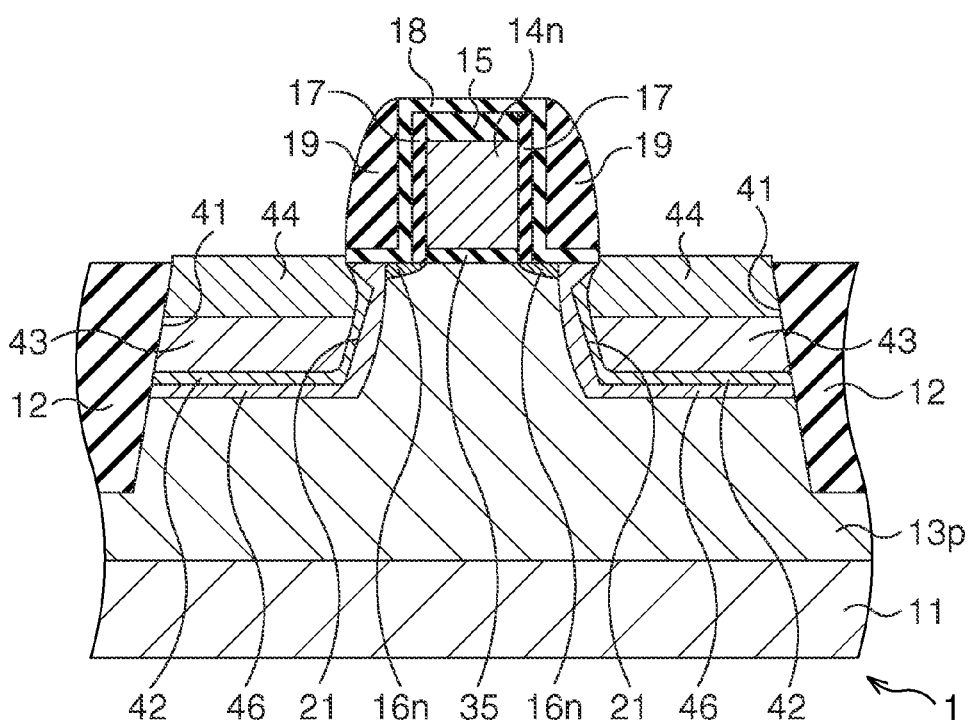

After that, a SiC layer 44 having a thickness of about 30 nm and having a C content of 2.0%, is formed as a third semiconductor layer on each of the SiC layers 43 through epitaxial growth, as illustrated in FIG. 9D. A lower surface of the SiC layer 44 positions below an interface between the channel region and the gate insulating film 35, and an upper surface of the SiC layer 44 positions above the interface. Specifically, the SiC layers 44 position on sides of the interface between the channel region and the gate insulating film 35.

Figure 9E:
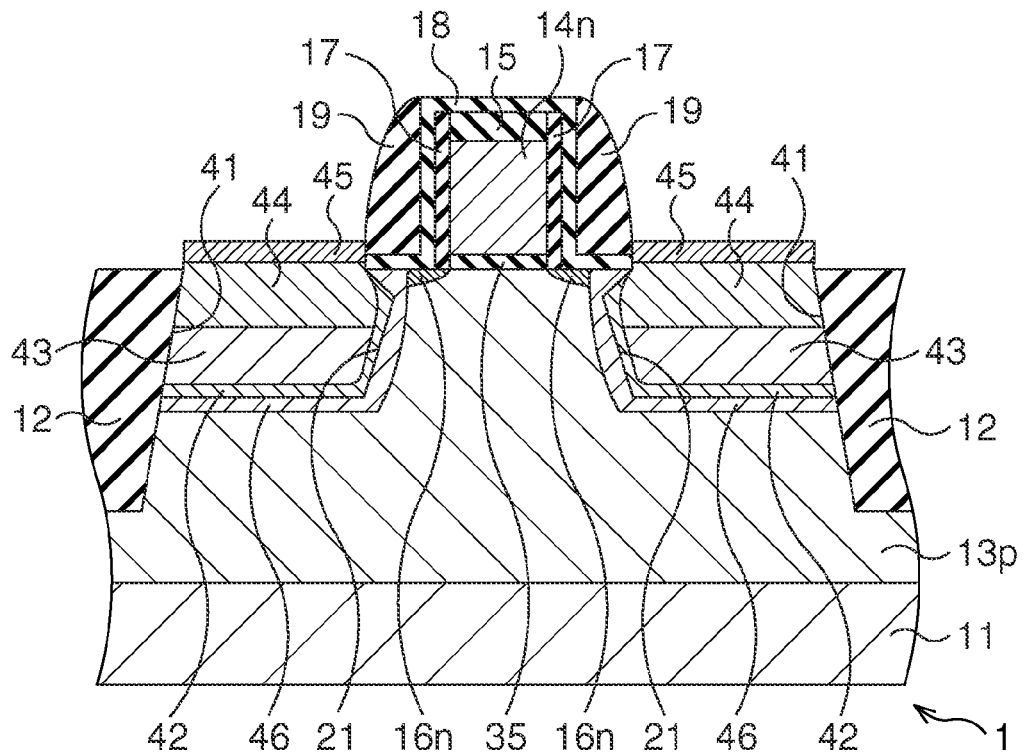

Subsequently, a silicon layer 45 having a thickness of about 5 nm to 10 nm is formed on each of the SiC layers 44 through epitaxial growth, as illustrated in FIG. 9E.

Thereafter, processing similar to the processing in the first embodiment with respect to the p-channel MOS transistor and the like are conducted, to thereby complete the semiconductor device.

According to the second embodiment as described above, since the SiC layers 42 having a high C content are formed before the formation of the SiC layers 43 having a rather low C content, the growth of the SiC layers 43 on the side surfaces of the recesses 41 is suppressed, and the sides of the channel region are almost completely occupied by the SiC layers 42 and 44. Further, the C content in the SiC layers 42 and 44 is rather high, so that it is possible to effectively generate the tensile strain in the channel region in the n-channel MOS transistor.

Note that in the second embodiment, it is also possible to adopt the method in the first embodiment when forming the p-channel MOS transistor.

Further, the C content in the SiC layers 42 and 44 is not particularly limited, and is 1% to 2.5%, for instance. Further, the C content in the upper surface of the SiC layer 43 is also not particularly limited, and is 1% to 2.5%, for instance, and the C content in the SiC layer 43 is also not particularly limited, and is 1% or less, for instance. Although the C content in the SiC layer 43 does not have to be graded, it may be lower than the C content in the SiC layer 42 and is preferably lower than the C content in the SiC layer 44.

Further, although the depth of the recess 41 and the thickness of the respective SiC layers are not particularly limited, the thickness of the SiC layer 42 is preferably 30 nm or less and more preferably 5 nm or less. Further, it is also possible that the upper surface of the SiC layer 44 is positioned at the same height as the interface between the silicon substrate 11 and the gate insulating film 35.

Further, the content of impurity in the SiC layers is also not particularly limited, but, it is preferable that the impurity content is set low in the SiC layer 44 having a high C content, and is set high, in the SiC layers 43 and 45 sandwiching the SiC layer 44, to $2\times10^{20}$ cm$^{-3}$ to $1\times10^{21}$ cm$^{-3}$, and particularly to $5\times10^{20}$ cm$^{-3}$ to $1\times10^{21}$ cm$^{-3}$. As such an impurity, P (phosphor) and As (arsenic) can be cited, for example.

Further, in the first and the second embodiments, it is also possible to form, before the formation of the interlayer insulating film 31, a film that makes a tensile stress in a lateral direction act on the channel region in the nMOS region 1 and to form a film that makes a compressive stress in the lateral direction act on the channel region in the pMOS region 2. As such a film, a silicon nitride film can be cited, for instance.

Figure 10:
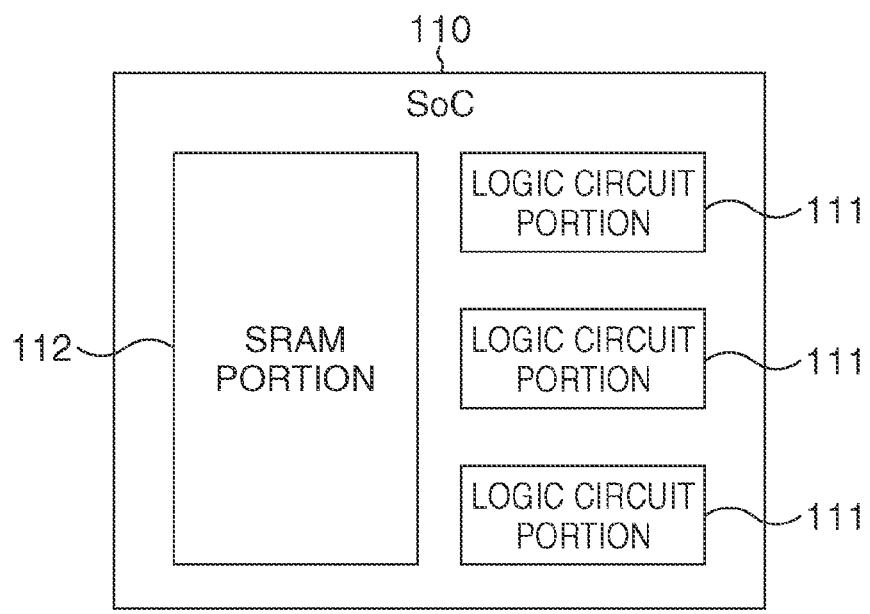
FIG. 10 is a layout diagram illustrating an example of SoC.

Such a transistor in which a strain is generated in its channel can be used in a logic circuit portion of an SoC (System on Chip), for instance. FIG. 10 illustrates an example of an SoC. In an SoC 110, three logic circuit portions 111 and an SRAM portion 112 are formed on one substrate. Further, the logic circuit portions 111 include the MOS transistors according to the first embodiment and the second embodiment.

Further, the transistor can also be used in an apparatus in which high-speed communication is performed, such as a cellular phone. FIG. 11 illustrates an example of a cellular phone. A cellular phone 120 is provided with an antenna 121 performing transmission/reception of radio waves to/from the outside, a speaker 125 outputting sound to the outside, and a microphone 126 inputting sound from the outside. Further, there are also provided with a transmission/reception processing portion 122 performing conversion between input/output signals of the antenna 121 and output/input signals of the speaker 125 and the microphone 126 and the like, a control portion 123 controlling the transmission/reception processing portion 122, and a memory 124 storing a program executed by the control portion 123 and the like. In addition, there are provided a display portion 127 displaying an operating state and the like, and an operation portion 128 such as a ten-key pad operated by a user. In such a cellular phone 120, the control portion 123 includes a high-frequency LSI. Further, the high-frequency LSI includes the MOS transistors according to the first embodiment and the second embodiment.

According to the semiconductor device and the manufacturing method thereof, since the first semiconductor layer having a content of Ge or C which is higher than that in the second semiconductor layer is formed to cover the bottom surface and the side surface of the recess, the strain caused by the third semiconductor layer can be effectively largely applied to the region right under the gate insulating film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A manufacturing method of a semiconductor device, comprising:
    forming a gate insulating film on a silicon substrate;
    forming a gate electrode on the gate insulating film;
    forming recesses in the silicon substrate of both sides of the gate electrode;
    forming a first semiconductor layer containing germanium so as to cover a bottom surface and a side surface of each of the recesses;
    forming a second semiconductor layer containing germanium at a lower content than a germanium content in the first semiconductor layer, on the first semiconductor layer; and
    forming a third semiconductor layer containing germanium, on the second semiconductor layer and directly on a part of the first semiconductor layer, the part of the first semiconductor layer being located between the side surface and the third semiconductor layer.

2. The method according to claim 1, wherein a germanium content in the third semiconductor layer is higher than a germanium content in the second semiconductor layer.

3. The method according to claim 2, wherein the germanium content in the first semiconductor layer is 25% to 35%.

4. The method according to claim 2, wherein the germanium content in the second semiconductor layer is 20% or less.

5. The method according to claim 2, wherein a surface of the third semiconductor layer is positioned at a same height as an interface between the silicon substrate and the gate insulating film or positioned above the interface.

6. The method according to claim 3, wherein the first to third semiconductor layers are silicon germanium layers.

7. The method according to claim 6, wherein a thickness of the first semiconductor layer is 30 nm or less.

8. The method according to claim 1, wherein impurities are introduced into the first to third semiconductor layers, and impurity contents in the first and the third semiconductor layers are higher than an impurity content in the second semiconductor layer.

9. The method according to claim 8, wherein the impurity content in the second semiconductor layer is $5 \times 10^{20}$ cm$^{-3}$ to $1 \times 10^{21}$ cm$^{-3}$.

10. The method according to claim 1, further comprising forming an impurity diffused layer in the silicon substrate before forming the recesses.

11. A manufacturing method of a semiconductor device, comprising:
    forming a gate insulating film on a silicon substrate;
    forming a gate electrode on the gate insulating film;
    forming recesses in the silicon substrate of both sides of the gate electrode;
    forming a first semiconductor layer containing carbon so as to cover a bottom surface and a side surface of each of the recesses;
    forming a second semiconductor layer containing carbon at a lower content than a carbon content in the first semiconductor layer, on the first semiconductor layer; and
    forming a third semiconductor layer containing carbon, on the second semiconductor layer and directly on a part of the first semiconductor layer, the part of the first semiconductor layer being located between the side surface and the third semiconductor layer.

12. The method according to claim 11, wherein a carbon content in the third semiconductor layer is higher than a carbon content in the second semiconductor layer.

13. The method according to claim 12, wherein the carbon content in the first semiconductor layer is 1% to 2.5%.

14. The method according to claim 12, wherein the carbon content in the second semiconductor layer is 1% or less.

15. The method according to claim 12, wherein a surface of the third semiconductor layer is positioned at a same height as an interface between the silicon substrate and the gate insulating film or positioned above the interface.

16. The method according to claim 13, wherein the first to third semiconductor layers are silicon carbide layers.

17. The method according to claim 16, wherein a thickness of the first semiconductor layer is 30 nm or less.

18. The method according to claim 11, wherein impurities are introduced into the first to third semiconductor layers, and impurity contents of the first and the third semiconductor layers are higher than an impurity content of the second semiconductor layer.

19. The method according to claim 18, wherein the impurity content in the second semiconductor layer is $5 \times 10^{20}$ cm$^{-3}$ to $1 \times 10^{21}$ cm$^{-3}$.

20. The method according to claim 11, further comprising forming an impurity diffused layer in the silicon substrate before forming the recesses.

* * * * *